United States Patent
Kalitsov et al.

(10) Patent No.: US 11,049,538 B2
(45) Date of Patent: Jun. 29, 2021

(54) VOLTAGE-CONTROLLED INTERLAYER EXCHANGE COUPLING MAGNETORESISTIVE MEMORY DEVICE AND METHOD OF OPERATING THEREOF

(71) Applicant: WESTERN DIGITAL TECHNOLOGIES, INC., San Jose, CA (US)

(72) Inventors: Alan Kalitsov, San Jose, CA (US); Bhagwati Prasad, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/824,814

(22) Filed: Mar. 20, 2020

(65) Prior Publication Data

US 2020/0234748 A1      Jul. 23, 2020

Related U.S. Application Data

(63) Continuation-in-part of application No. 16/250,403, filed on Jan. 17, 2019, now Pat. No. 10,788,547.

(51) Int. Cl.
*G11C 11/16* (2006.01)
*H01L 27/22* (2006.01)

(52) U.S. Cl.
CPC ........ *G11C 11/161* (2013.01); *G11C 11/1655* (2013.01); *G11C 11/1657* (2013.01); *G11C 11/1659* (2013.01); *G11C 11/1673* (2013.01); *G11C 11/1675* (2013.01); *G11C 11/1697* (2013.01); *H01L 27/222* (2013.01)

(58) Field of Classification Search
CPC ............ G11C 11/1697; G11C 11/1657; G11C 11/1675
See application file for complete search history.

(56) References Cited

U.S. PATENT DOCUMENTS

| | | | |
|---|---|---|---|
| 6,782,947 B2 | 8/2004 | De Rouffignac et al. |
| 6,880,633 B2 | 4/2005 | Wellington et al. |
| 6,915,850 B2 | 4/2005 | Vinegar et al. |

(Continued)

FOREIGN PATENT DOCUMENTS

JP     2010-225224 A     10/2010

OTHER PUBLICATIONS

USPTO Office Communication, Notice of Allowance and Fee(s), for U.S. Appl. No. 16/250,403, dated May 29, 2020, 23 pages.

(Continued)

*Primary Examiner* — Alvaro E Fortich
(74) *Attorney, Agent, or Firm* — The Marbury Law Group PLLC

(57) ABSTRACT

A magnetoresistive memory device includes a magnetic tunnel junction comprising a free layer, a reference layer, and an insulating tunnel barrier layer located between the free layer and the reference layer, a perpendicular magnetic anisotropy (PMA) ferromagnetic layer that is vertically spaced from the free layer, an electrically conductive, non-magnetic interlayer exchange coupling layer located between the free layer and the PMA ferromagnetic layer. The magnetoresistive memory device is a hybrid magnetoresistive memory device which is programmed by a combination of a spin-torque transfer effect and a voltage-controlled exchange coupling effect.

17 Claims, 15 Drawing Sheets

(56) References Cited

U.S. PATENT DOCUMENTS

| | | |
|---|---|---|
| 6,918,442 B2 | 7/2005 | Wellington et al. |
| 6,918,443 B2 | 7/2005 | Wellington et al. |
| 6,923,257 B2 | 8/2005 | Wellington et al. |
| 6,932,155 B2 | 8/2005 | Vinegar et al. |
| 6,948,562 B2 | 9/2005 | Wellington et al. |
| 6,951,247 B2 | 10/2005 | De Rouffignac et al. |
| 6,964,300 B2 | 11/2005 | Vinegar et al. |
| 6,966,374 B2 | 11/2005 | Vinegar et al. |
| 6,969,123 B2 | 11/2005 | Vinegar et al. |
| 6,981,548 B2 | 1/2006 | Wellington et al. |
| 6,991,032 B2 | 1/2006 | Berchenko et al. |
| 6,991,033 B2 | 1/2006 | Wellington et al. |
| 6,991,036 B2 | 1/2006 | Sumnu-Dindoruk et al. |
| 6,991,045 B2 | 1/2006 | Vinegar et al. |
| 6,994,169 B2 | 2/2006 | Zhang et al. |
| 6,997,518 B2 | 2/2006 | Vinegar et al. |
| 7,004,251 B2 | 2/2006 | Ward et al. |
| 7,011,154 B2 | 3/2006 | Maher et al. |
| 7,013,972 B2 | 3/2006 | Vinegar et al. |
| 7,032,660 B2 | 4/2006 | Vinegar et al. |
| 7,040,397 B2 | 5/2006 | De Rouffignac et al. |
| 7,040,398 B2 | 5/2006 | Wellington et al. |
| 7,040,399 B2 | 5/2006 | Wellington et al. |
| 7,040,400 B2 | 5/2006 | De Rouffignac et al. |
| 7,051,807 B2 | 5/2006 | Vinegar et al. |
| 7,051,811 B2 | 5/2006 | De Rouffignac et al. |
| 7,055,600 B2 | 6/2006 | Messier et al. |
| 7,063,145 B2 | 6/2006 | Veenstra et al. |
| 7,066,254 B2 | 6/2006 | Vinegar et al. |
| 7,066,257 B2 | 6/2006 | Wellington et al. |
| 7,077,198 B2 | 7/2006 | Vinegar et al. |
| 7,077,199 B2 | 7/2006 | Vinegar et al. |
| 7,086,465 B2 | 8/2006 | Wellington et al. |
| 7,090,013 B2 | 8/2006 | Wellington |
| 7,100,994 B2 | 9/2006 | Vinegar et al. |
| 7,104,319 B2 | 9/2006 | Vinegar et al. |
| 7,128,153 B2 | 10/2006 | Vinegar et al. |
| 7,165,615 B2 | 1/2007 | Vinegar et al. |
| 7,277,319 B2 | 10/2007 | Perner et al. |
| 7,345,911 B2 | 3/2008 | Min et al. |
| 7,359,235 B2 | 4/2008 | Katti |
| 7,366,009 B2 | 4/2008 | Katti |
| 7,486,545 B2 | 2/2009 | Min et al. |
| 7,588,945 B2 | 9/2009 | Min et al. |
| 7,800,942 B2 | 9/2010 | Chen et al. |
| 7,813,168 B2 | 10/2010 | Zhu et al. |
| 7,855,923 B2 | 12/2010 | Li et al. |
| 7,974,119 B2 | 7/2011 | Chen et al. |
| 7,974,121 B2 | 7/2011 | Li et al. |
| 8,045,361 B2 | 10/2011 | Lee et al. |
| 8,045,366 B2 | 10/2011 | Zheng et al. |
| 8,084,835 B2 | 12/2011 | Ranjan et al. |
| 8,098,538 B2 | 1/2012 | Reed et al. |
| 8,116,122 B2 | 2/2012 | Li et al. |
| 8,116,123 B2 | 2/2012 | Chen et al. |
| 8,199,562 B2 | 6/2012 | Zhu et al. |
| 8,199,563 B2 | 6/2012 | Chen et al. |
| 8,203,875 B2 | 6/2012 | Amin et al. |
| 8,203,893 B2 | 6/2012 | Li et al. |
| 8,208,291 B2 | 6/2012 | Kim et al. |
| 8,208,295 B2 | 6/2012 | Dieny |
| 8,289,756 B2 | 10/2012 | Zheng et al. |
| 8,295,082 B2 | 10/2012 | Chua-Eoan et al. |
| 8,331,141 B2 | 12/2012 | Shukh |
| 8,405,173 B2 | 3/2013 | Kim et al. |
| 8,406,041 B2 | 3/2013 | Shukh |
| 8,411,494 B2 | 4/2013 | Shukh |
| 8,416,615 B2 | 4/2013 | Chen et al. |
| 8,422,279 B2 | 4/2013 | Zheng et al. |
| 8,477,530 B2 | 7/2013 | Ranjan et al. |
| 8,493,776 B1 | 7/2013 | Yu et al. |
| 8,570,797 B2 | 10/2013 | Kim et al. |
| 8,604,772 B2 | 12/2013 | Berkcan et al. |
| 8,670,266 B2 | 3/2014 | Jung et al. |
| 8,687,412 B2 | 4/2014 | Chih et al. |
| 8,719,187 B2 | 5/2014 | Milanes Garcia-Moreno |
| 8,754,491 B2 | 6/2014 | Abraham et al. |
| 8,842,968 B2 | 9/2014 | Toji |
| 8,902,641 B2 | 12/2014 | Chih et al. |
| 8,963,264 B2 | 2/2015 | Dimitrov et al. |
| 9,082,888 B2 | 7/2015 | Kent et al. |
| 9,082,950 B2 | 7/2015 | Kent et al. |
| 9,171,589 B2 | 10/2015 | Kim et al. |
| 9,171,601 B2 | 10/2015 | Shukh |
| 9,287,322 B2 | 3/2016 | Chepulskyy et al. |
| 9,460,397 B2 | 10/2016 | Apalkov et al. |
| 9,502,092 B2 | 11/2016 | Zhou et al. |
| 9,570,139 B2 | 2/2017 | Manipatruni et al. |
| 9,595,561 B2 | 3/2017 | Lee |
| 9,627,024 B2 | 4/2017 | Chen et al. |
| 9,672,886 B2 | 6/2017 | Wang et al. |
| 9,754,639 B2 | 9/2017 | Lee et al. |
| 9,830,966 B2 | 11/2017 | Mihajlovic et al. |
| 9,847,374 B2 | 12/2017 | Fukuzawa |
| 10,153,017 B2 | 12/2018 | Yang et al. |
| 2003/0079877 A1 | 5/2003 | Wellington et al. |
| 2003/0080604 A1 | 5/2003 | Vinegar et al. |
| 2003/0098149 A1 | 5/2003 | Wellington et al. |
| 2003/0098605 A1 | 5/2003 | Vinegar et al. |
| 2003/0100451 A1 | 5/2003 | Messier et al. |
| 2003/0102124 A1 | 6/2003 | Vinegar et al. |
| 2003/0102125 A1 | 6/2003 | Wellington et al. |
| 2003/0102126 A1 | 6/2003 | Sumnu-Dindoruk et al. |
| 2003/0102130 A1 | 6/2003 | Vinegar et al. |
| 2003/0111223 A1 | 6/2003 | Rouffignac et al. |
| 2003/0116315 A1 | 6/2003 | Wellington et al. |
| 2003/0130136 A1 | 7/2003 | Rouffignac et al. |
| 2003/0131993 A1 | 7/2003 | Zhang et al. |
| 2003/0131994 A1 | 7/2003 | Vinegar et al. |
| 2003/0131995 A1 | 7/2003 | De Rouffignac et al. |
| 2003/0131996 A1 | 7/2003 | Vinegar et al. |
| 2003/0136558 A1 | 7/2003 | Wellington et al. |
| 2003/0136559 A1 | 7/2003 | Wellington et al. |
| 2003/0137181 A1 | 7/2003 | Wellington et al. |
| 2003/0141067 A1 | 7/2003 | Rouffignac et al. |
| 2003/0141068 A1 | 7/2003 | Pierre de Rouffignac et al. |
| 2003/0142964 A1 | 7/2003 | Wellington et al. |
| 2003/0146002 A1 | 8/2003 | Vinegar et al. |
| 2003/0148894 A1 | 8/2003 | Vinegar et al. |
| 2003/0155111 A1 | 8/2003 | Vinegar et al. |
| 2003/0164239 A1 | 9/2003 | Wellington et al. |
| 2003/0173072 A1 | 9/2003 | Vinegar et al. |
| 2003/0173078 A1 | 9/2003 | Wellington et al. |
| 2003/0173080 A1 | 9/2003 | Berchenko et al. |
| 2003/0173081 A1 | 9/2003 | Vinegar et al. |
| 2003/0173082 A1 | 9/2003 | Vinegar et al. |
| 2003/0173085 A1 | 9/2003 | Vinegar et al. |
| 2003/0178191 A1 | 9/2003 | Maher et al. |
| 2003/0183390 A1 | 10/2003 | Veenstra et al. |
| 2003/0192691 A1 | 10/2003 | Vinegar et al. |
| 2003/0192693 A1 | 10/2003 | Wellington et al. |
| 2003/0196788 A1 | 10/2003 | Vinegar et al. |
| 2003/0196789 A1 | 10/2003 | Wellington et al. |
| 2003/0196801 A1 | 10/2003 | Vinegar et al. |
| 2003/0196810 A1 | 10/2003 | Vinegar et al. |
| 2003/0201098 A1 | 10/2003 | Karanikas et al. |
| 2003/0205378 A1 | 11/2003 | Wellington et al. |
| 2003/0209348 A1 | 11/2003 | Ward et al. |
| 2004/0020642 A1 | 2/2004 | Vinegar et al. |
| 2004/0040715 A1 | 3/2004 | Wellington et al. |
| 2004/0199476 A1 | 10/2004 | Milanes Garcia-Moreno |
| 2005/0152180 A1 | 7/2005 | Katti |
| 2006/0039191 A1 | 2/2006 | Perner et al. |
| 2006/0113619 A1 | 6/2006 | Hung et al. |
| 2007/0097734 A1 | 5/2007 | Min et al. |
| 2007/0189064 A1 | 8/2007 | Min et al. |
| 2007/0211523 A1 | 9/2007 | Kim |
| 2007/0291530 A1 | 12/2007 | Katti |
| 2008/0094886 A1 | 4/2008 | Ranjan et al. |
| 2008/0160641 A1 | 7/2008 | Min et al. |
| 2008/0247072 A1 | 10/2008 | Nozieres et al. |
| 2008/0310219 A1 | 12/2008 | Chen et al. |
| 2009/0008134 A1 | 1/2009 | Tsuneoka et al. |

(56) References Cited

U.S. PATENT DOCUMENTS

| | | | |
|---|---|---|---|
| 2009/0073599 A1* | 3/2009 | Nemoto | G11B 5/65 |
| | | | 360/77.02 |
| 2009/0323402 A1 | 12/2009 | Li et al. | |
| 2009/0323403 A1 | 12/2009 | Chen et al. | |
| 2010/0039136 A1 | 2/2010 | Chua-Eoan et al. | |
| 2010/0091549 A1 | 4/2010 | Lee et al. | |
| 2010/0103729 A1 | 4/2010 | Zhu et al. | |
| 2010/0109108 A1 | 5/2010 | Zheng et al. | |
| 2010/0110763 A1 | 5/2010 | Li et al. | |
| 2010/0128520 A1 | 5/2010 | Zheng et al. | |
| 2010/0238711 A1 | 9/2010 | Asao | |
| 2011/0007560 A1 | 1/2011 | Dieny et al. | |
| 2011/0044099 A1 | 2/2011 | Dieny | |
| 2011/0075471 A1 | 3/2011 | Zhu et al. | |
| 2011/0080782 A1 | 4/2011 | Li et al. | |
| 2011/0122678 A1 | 5/2011 | Amin et al. | |
| 2011/0170338 A1 | 7/2011 | Kim et al. | |
| 2011/0205788 A1 | 8/2011 | Reed et al. | |
| 2011/0228598 A1 | 9/2011 | Chen et al. | |
| 2011/0241702 A1 | 10/2011 | Berkcan et al. | |
| 2011/0299324 A1 | 12/2011 | Li et al. | |
| 2011/0303996 A1 | 12/2011 | Kim et al. | |
| 2012/0039115 A1 | 2/2012 | Zheng et al. | |
| 2012/0069649 A1 | 3/2012 | Ranjan et al. | |
| 2012/0120719 A1 | 5/2012 | Worledge | |
| 2012/0155153 A1 | 6/2012 | Shukh | |
| 2012/0155154 A1 | 6/2012 | Shukh | |
| 2012/0155164 A1 | 6/2012 | Shukh | |
| 2012/0218815 A1 | 8/2012 | Kim et al. | |
| 2012/0230093 A1 | 9/2012 | Chen et al. | |
| 2012/0280338 A1 | 11/2012 | Abraham et al. | |
| 2013/0148429 A1 | 6/2013 | Kim et al. | |
| 2013/0194862 A1 | 8/2013 | Jung et al. | |
| 2013/0201754 A1 | 8/2013 | Yu et al. | |
| 2013/0221459 A1* | 8/2013 | Jan | H01L 43/12 |
| | | | 257/421 |
| 2013/0249025 A1* | 9/2013 | Natori | H01L 43/12 |
| | | | 257/421 |
| 2013/0250669 A1 | 9/2013 | Shukh | |
| 2013/0258762 A1 | 10/2013 | Chih et al. | |
| 2013/0265820 A1 | 10/2013 | Chih et al. | |
| 2014/0001585 A1 | 1/2014 | Dimitrov et al. | |
| 2014/0010003 A1* | 1/2014 | Zhou | H01L 43/08 |
| | | | 365/158 |
| 2014/0042508 A1 | 2/2014 | Lee | |
| 2014/0103472 A1 | 4/2014 | Kent et al. | |
| 2014/0103473 A1 | 4/2014 | Kent et al. | |
| 2014/0145792 A1* | 5/2014 | Wang | H01F 10/329 |
| | | | 331/94.1 |
| 2014/0252438 A1 | 9/2014 | Shukh | |
| 2015/0097159 A1 | 4/2015 | Apalkov et al. | |
| 2015/0131370 A1* | 5/2015 | Zhou | G11C 11/1675 |
| | | | 365/158 |
| 2015/0228323 A1 | 8/2015 | Manipatruni et al. | |
| 2015/0325623 A1 | 11/2015 | Chepulskyy et al. | |
| 2016/0180908 A1 | 6/2016 | Zhou et al. | |
| 2016/0197263 A1 | 7/2016 | Hu | |
| 2016/0225427 A1 | 8/2016 | Chen et al. | |
| 2016/0240771 A1 | 8/2016 | Hu | |
| 2016/0260771 A1 | 9/2016 | Fukuzawa | |
| 2017/0084322 A1 | 3/2017 | Wang et al. | |
| 2017/0125071 A1 | 5/2017 | Lee et al. | |
| 2017/0125078 A1 | 5/2017 | Mihajlovic et al. | |
| 2017/0338279 A1 | 11/2017 | Yang et al. | |
| 2018/0005746 A1* | 1/2018 | Thomas | H01L 43/10 |
| 2018/0075891 A1 | 3/2018 | Yang et al. | |
| 2018/0240844 A1 | 8/2018 | Yang et al. | |

OTHER PUBLICATIONS

Bruno, P. et al., "Ruderman-Kittel Theory of Oscillatory Interlayer Exchange Coupling," The American Physical Society, Physical Review B, vol. 46, No. 1, pp. 261-270, (1992).

Herper, H. C., et al., "Influence of the interlayer exchange coupling on the electric transport in Fe/Cr/Fe and Fe/Cr/T/Fe (T=Mn, V): An ab initio study," The American Physical Society, Physical Review B vol. 68, pp. 134421-1 to 134421-10 , (2003).

Kalitsov, A. et al., "Impurity-Induced Tuning of Quantum-Well States in Spin-Dependent Resonant Tunneling," The American Physical Society, Physica l R evi ew L et t ers, vol. 93, No. 4, pp. 046603-1 to 046603-4, (2004).

Opitz, J. et al., "Ab initio Calculation of the Interlayer Exchange Coupling in Fe/Au Multilayers: The Role of Impurities at the Interface," The American Physical Society , Physical Review B, vol. 63, pp. 094418-1 to 094418-6, (2001).

Parkin, S.S.P., "Dramatic Enhancement of Interlayer Exchange Coupling and Giant Magnetoresistance in $Ni_{81}Fe_{19}$/Cu Multilayers by Addition of Thin Co Interface Layers," Appl. Phys. Lett., vol. 61, pp. 1358-1360, (1992).

Parkin, S.S.P. et al., "Oscillations in Exchange Coupling and Magnetoresistance in Metallic Superlattice Structures: Co/Ru, Co/Cr, and Fe/Cr" The American Physical Society, Physical Review Letters, vol. 64, No. 19, pp. 2304-2308, (1990).

Yoshihara, A. et al., "Interlayer Exchange Coupling in Fine-Layered Fe/Au Superlattices," The American Physical Society, Physical Review B, vol. 63, pp. 100405-1 to 100405-4, (2001).

Notification of Transmittal of the International Search Report and Written Opinion of the International Search Authority for International Patent Application No. PCT/US2019/062573, dated Mar. 9, 2020, 9 pages.

G.A. Bertero et al., "Interface structure and perpendicular magnetic anisotropy in Pt/Co multilayers", Journal of Applied Physics 77, 3953 (1995); https://doi.org/10.1063/1.358577, 8 pages.

G.A. Bertero et al., "Kerr Rotations and Anisotropy in (Pt/Co/Pt)/X Multilayers", IEEE Transactions on Magnetics, vol. 31, No. 6, Nov. 1995, 6 pages.

M. Ohtake et al. "L10 ordered phase formation in FePt, FePd, CoPt, and CoPd alloy thin films epitaxially grown on MgO(001) single-crystal substrates", J. Appl. Phys. 111, 07A708 (2012); https://doi.org/10.1063/1.3672856, 4 pages.

Notification of Transmittal of the International Search Report and Written Opinion of the International Search Authority for International Patent Application No. PCT/US2020/037964, dated Dec. 1, 2020, 9 pages.

* cited by examiner

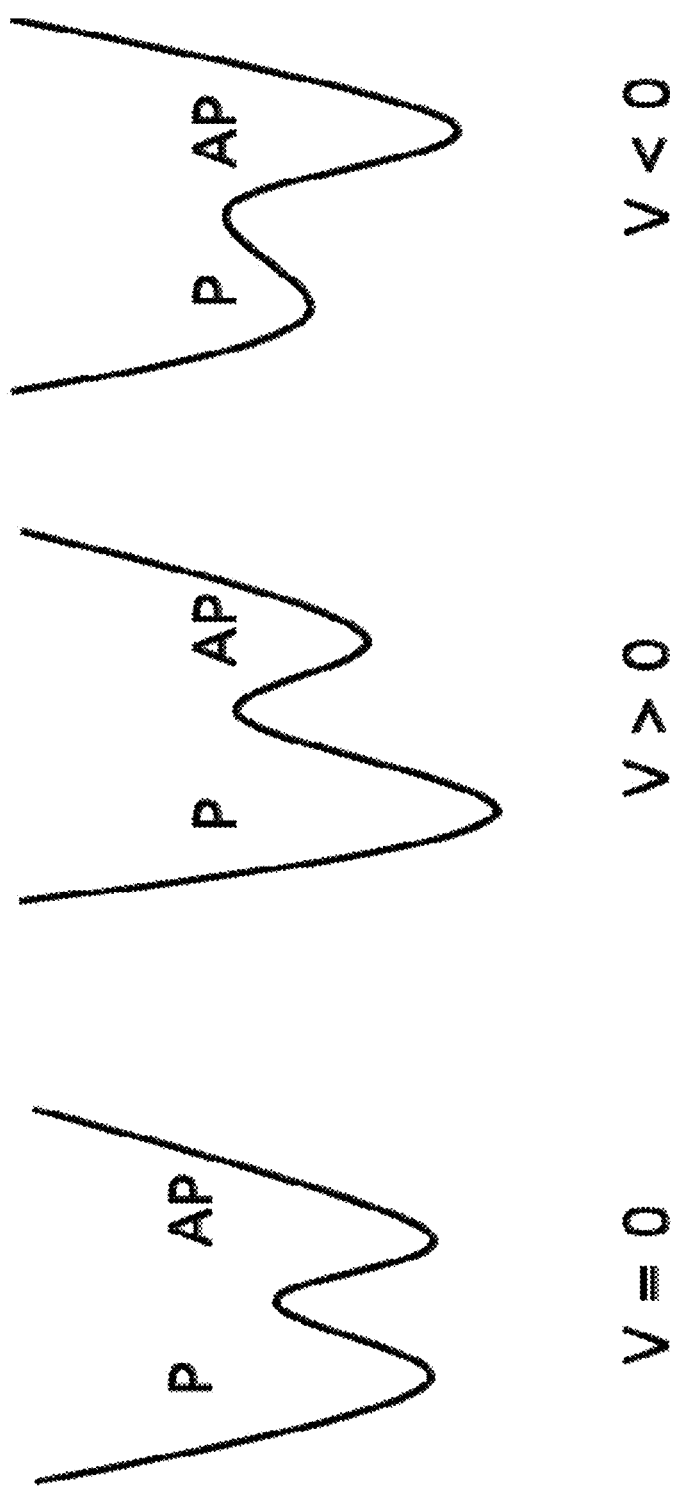

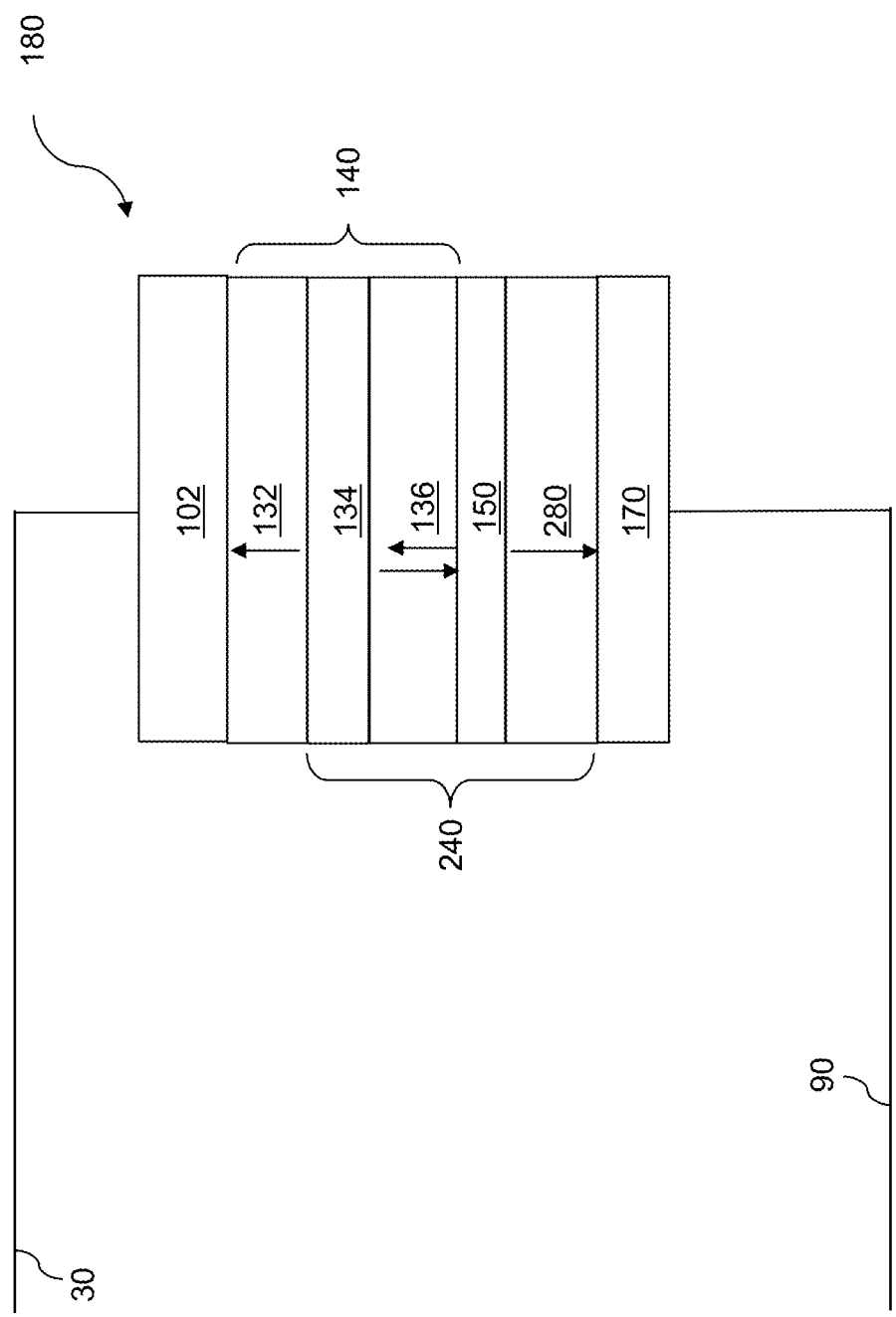

VOLTAGE-CONTROLLED INTERLAYER EXCHANGE COUPLING MAGNETORESISTIVE MEMORY DEVICE AND METHOD OF OPERATING THEREOF

RELATED APPLICATIONS

The instant application is a continuation-in-part (CIP) application of U.S. application Ser. No. 16/250,403 filed on Jan. 17, 2019, the entire contents of which are incorporated herein by reference.

FIELD

The present disclosure relates generally to the field of magnetoresistive memory devices and specifically to a magnetoresistive memory device employing voltage-controlled interlayer exchange coupling to facilitate programming and methods of operating the same.

BACKGROUND

A magnetoresistive memory device can store information employing the difference in electrical resistance of a first configuration in which a free magnetization layer has a magnetization direction that is parallel to the magnetization of a reference magnetization layer and a second configuration in which the free magnetization layer has a magnetization direction that is antiparallel to the magnetization of the reference magnetization layer. Programming of the magnetoresistive memory device requires flipping of the direction of the magnetization of the free layer employing various external power source, which may be magnetic in nature or may employ a spin transfer mechanism.

Scalability of spin torque transfer magnetoresistive random access memory (STT-MRAM) devices require a higher than desired current for operation. Scalability of the STT-MRAM devices based on interfacial perpendicular magnetic anisotropy dictates a need to significantly enhance perpendicular magnetic anisotropy (PMA) to achieve required thermal stability for reliable information retention in MRAM devices. At the same time efficient magnetization manipulation is desired for low power consumption during writing information. The need to simultaneously have high energy barriers for retention and low energy barriers for efficient switching is a key challenge for systems with high PMA.

Voltage-controlled magnetic anisotropy (VCMA) is a more energy efficient method for magnetization switching since it is driven by voltage rather than by current. However, it is very challenging to achieve a large enough VCMA effect to overcome PMA. In addition, VCMA switching relies on precessional magnetization switching that has to be precisely controlled by the duration of the voltage pulse. This may result in large writing errors due to the distribution of magnetic properties in different memory cells.

SUMMARY

According to an aspect of the present disclosure, a magnetoresistive memory device comprises a first electrode, a second electrode, and a first layer stack located between the first electrode and the second electrode. The first layer stack comprises a free layer, a reference layer, an insulating layer located between the free layer and the reference layer, a ferromagnetic layer, and an electrically conductive, non-magnetic interlayer exchange coupling layer located between the free layer and the ferromagnetic layer.

According to an aspect of the present disclosure, a magnetoresistive memory device includes a magnetic-exchange-coupled layer stack comprising a free layer, a reference layer and an electrically conductive, non-magnetic interlayer exchange coupling layer located between the free layer and the reference layer, and an insulating spacer layer located in a series connection with the magnetic-exchange-coupled layer stack between a first electrode and a second electrode. The first electrode and the second electrode are configured to provide a programming voltage across the magnetic-exchange-coupled layer stack and the insulating spacer layer.

According to another aspect of the present disclosure a method of operating a magnetoresistive memory device is provided. The device comprises a magnetic-exchange-coupled layer comprising a free layer, a reference layer and an electrically conductive, non-magnetic interlayer exchange coupling layer located between the free layer and the reference layer, and an insulating spacer layer located in a series connection with the magnetic-exchange-coupled layer stack between a first electrode and a second electrode. The method comprises applying a first polarity programming voltage between the first electrode and the second electrode across the magnetic-exchange-coupled layer stack and the insulating spacer layer to switch a magnetization of the free layer from a parallel state to an antiparallel state with the reference layer, and applying a second polarity programming voltage opposite to the first polarity voltage between the first electrode and the second electrode across the magnetic-exchange-coupled layer stack and the insulating spacer layer to switch the magnetization of the free layer from the antiparallel state to the parallel state with the reference layer.

BRIEF DESCRIPTION OF THE DRAWINGS

FIG. 3 schematically illustrates voltage induced changes in magnetic anisotropy energy for parallel and antiparallel configurations of the free layer in the exemplary magnetoresistive memory cells of the present disclosure.

FIG. 8A is a schematic vertical cross-sectional view of a third configuration of a hybrid magnetoresistive memory cell according to an embodiment of the present disclosure.

DETAILED DESCRIPTION

Figure 1:
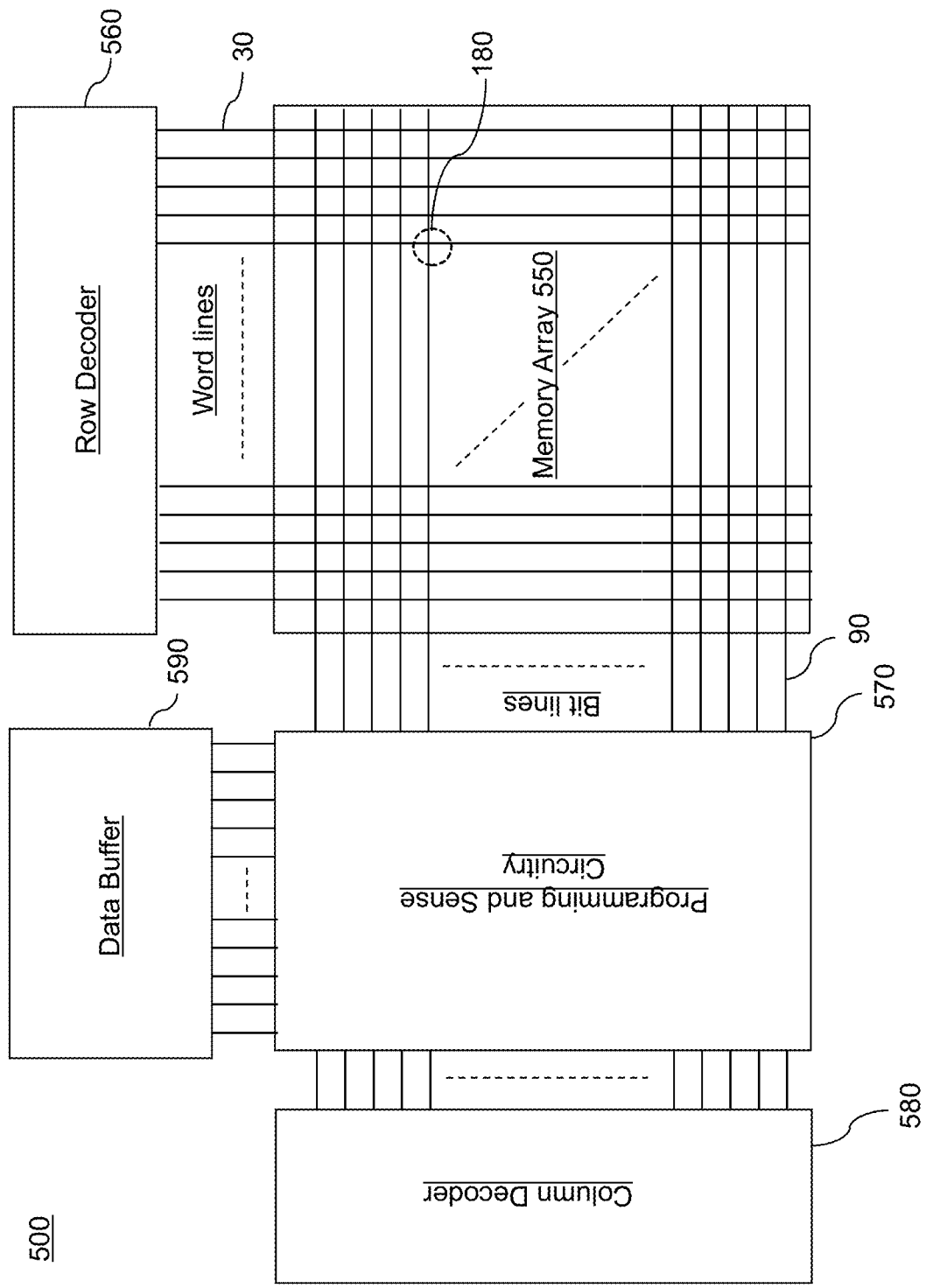
FIG. 1 is a schematic diagram of a random access memory device including magnetoresistive memory cells of the present disclosure in an array configuration.

As discussed above, the embodiments of the present disclosure are directed to a magnetoresistive memory device employing voltage-controlled exchange coupling (VCEC) (which includes voltage-controlled interlayer exchange coupling) to facilitate programming the various aspects of which are described below. A VCEC MRAM device uses less energy for programming to induce the transition between an antiparallel state and a parallel state of the free layer than a corresponding STT-MRAM device and provides deterministic switching and higher accuracy than a corresponding VCMA MRAM device.

A VCEC MRAM device includes a stack containing an electrically conductive, non-magnetic interlayer exchange coupling layer located between the free and reference layers and an optional electrically insulating spacer layer, which acts as a resistor, located in series with the stack. The VCEC MRAM device is programmed by application of a voltage to the stack without applying (i.e., in the absence of) an external magnetic field. Thus, external magnets are preferably not used in the VCEC MRAM device.

The state of the VCEC MRAM device can be sensed (i.e., read/determined) by utilizing the giant magnetoresistive (GMR) effect due to the presence of the non-magnetic, electrically conductive interlayer exchange coupling layer. In contrast, the state of the STT-MRAM device is sensed (i.e., read/determined) by the tunneling magnetoresistance (TMR) effect due to the presence of an electrically insulating tunneling barrier between the free and reference layers. Likewise, the VCMA MRAM device contains an insulating barrier layer between the free and reference layers. In contrast, the VCEC MRAM device preferably lacks an insulating tunneling barrier layer between the free and reference layers in the stack to promote exchange coupling between the ferromagnetic layers.

According to an aspect of the present disclosure, voltage-controlled exchange coupling (VCEC) is employed to reduce the energy barrier for transition between two magnetoresistive states. The inventors recognized that the VCEC effect can be at least one order of magnitude larger than the VCMA effect. Further, the polarity of the VCEC effect can be reversed by switching voltage polarity, thereby providing deterministic switching of the free layer in a magnetoresistive memory cell, in contrast to the VCMA MRAM devices which operate essentially as a toggle switch.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are employed merely to identify similar elements, and different ordinals may be employed across the specification and the claims of the instant disclosure.

As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified. The term "at least one" element refers to all possibilities including the possibility of a single element and the possibility of multiple elements.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

Referring to FIG. 1, a schematic diagram is shown for a magnetoresistive memory device 500 including multiple magnetoresistive memory cells 180 of embodiments of the present disclosure. In one embodiment, the magnetoresistive memory device 500 can be configured as a magnetoresistive random access memory (MRAM) device containing a two-dimensional array or a three-dimensional array of magnetoresistive memory cell 180 of the embodiments of the present disclosure. As used herein, a "random access memory device" refers to a memory device containing memory cells that allow random access, e.g., access to any selected memory cell upon a command for reading the contents of the selected memory cell.

The magnetoresistive memory device 500 can include a memory array region 550 containing an array of the respective magnetoresistive memory cells 180 located at the intersection of the respective word lines 30 and bit lines 90. The magnetoresistive memory device 500 may also contain a row decoder 560 connected to the word lines 30, a combination of a programming and sense circuitry 570 (which can include programming transistors, sense amplifiers, and other bit line control circuitry) connected to the bit lines 90, a column decoder 580 connected to the bit lines 90 through the programming and sense circuitry 570, and a data buffer 590 connected to the programming and sense circuitry 570. Multiple instances of the magnetoresistive memory cells 180 are provided in an array configuration that forms the magnetoresistive memory device 500. As such, each of the magnetoresistive memory cells 180 can be a two-terminal device including a respective first electrode and a respective second electrode. It should be noted that the location and interconnection of elements are schematic and the elements may be arranged in a different configuration. Further, a magnetoresistive memory cell 180 may be manufactured as a discrete device, i.e., a single isolated device.

Figure 2A:
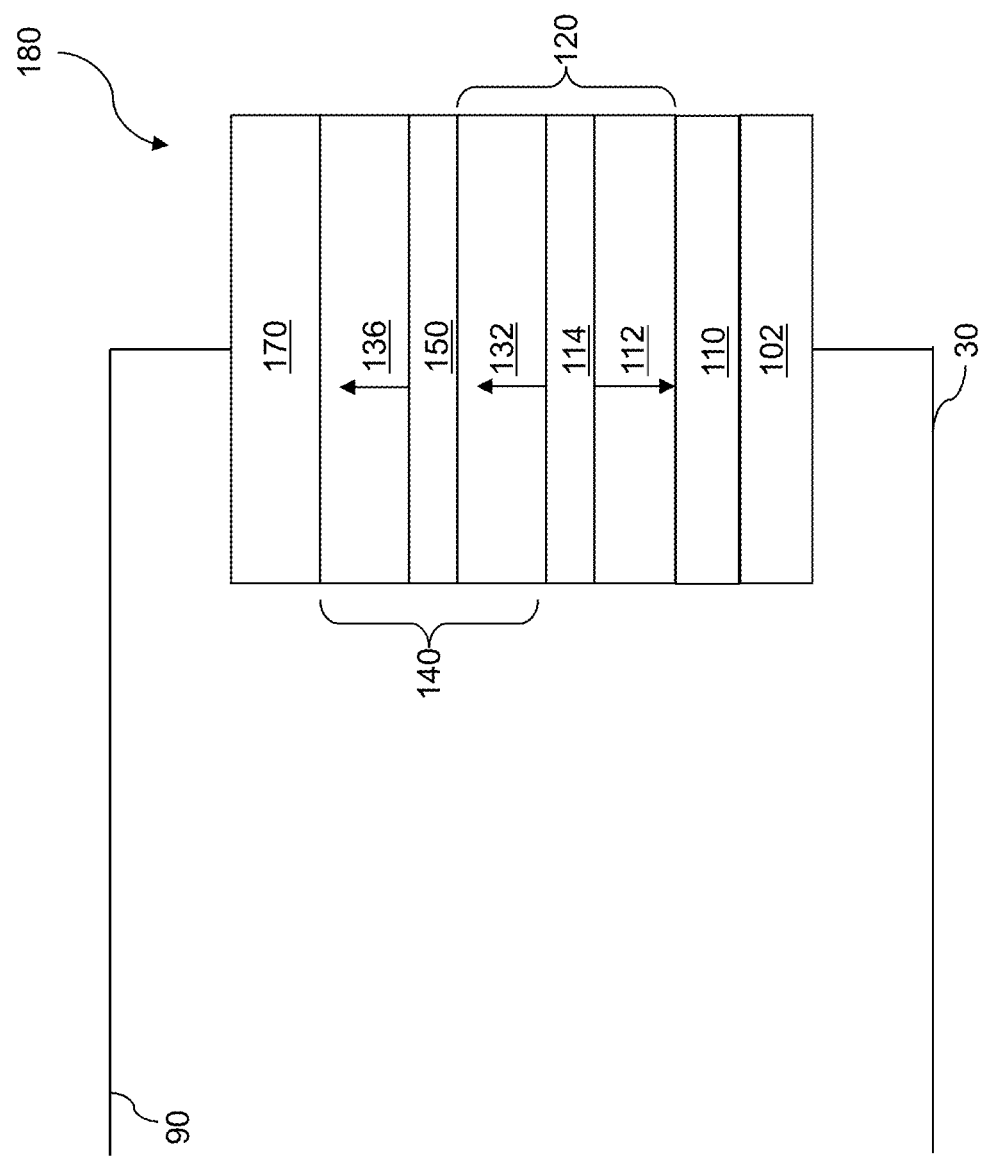
FIG. 2A illustrates a first configuration of an exemplary magnetoresistive memory cell according to an embodiment of the present disclosure.
Figure 2B:
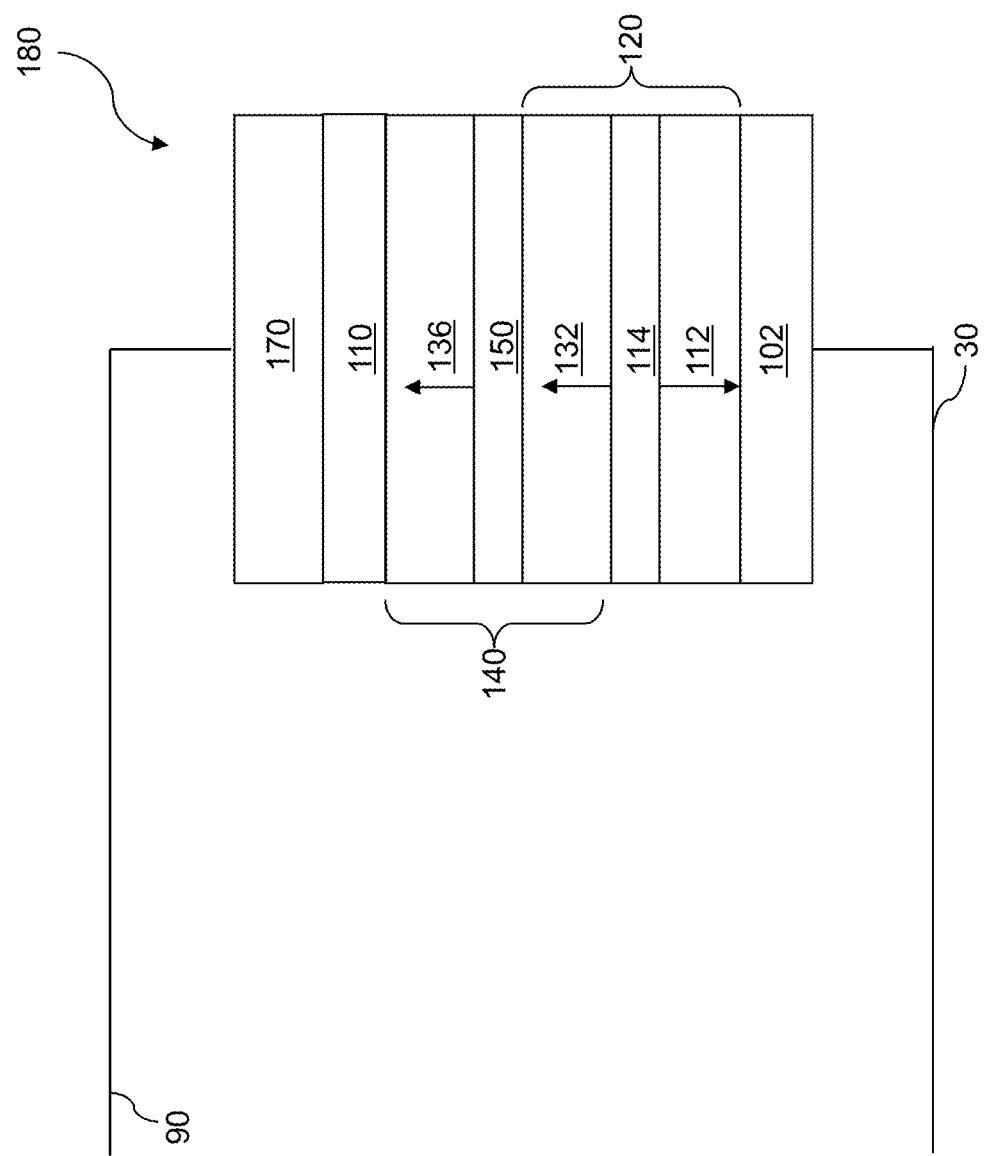
FIG. 2B illustrates a second configuration of the exemplary magnetoresistive memory cell according to an embodiment of the present disclosure.

FIGS. 2A and 2B illustrate a first configuration and a second configuration of an exemplary magnetoresistive memory cell 180 according to an embodiment of the present disclosure, respectively. The magnetoresistive memory cell 180 can include a series connection of a magnetic-exchange-coupled layer stack 140 and an optional first insulating spacer layer 110, which functions as a resistor during programming and reading operations. As used herein, a "magnetic-exchange-coupled layer stack" includes a layer stack including a first ferromagnetic layer (e.g., reference layer), a magnetic exchange coupling layer, and a second ferromagnetic layer (e.g., free layer). The stack is configured such that the magnetic exchange coupling layer provides magnetic exchange coupling between the first ferromagnetic layer and the second ferromagnetic layer.

The magnetic-exchange-coupled layer stack 140 can include a first reference layer 132 having a fixed magnetization direction, a free layer 136 having an easy axis of magnetization that is parallel or antiparallel to the fixed magnetization direction, and an electrically conductive, non-magnetic interlayer exchange coupling layer 150 located between the first reference layer 132 and the free layer 136. Preferably, the coupling layer comprises a metallic material, such as a pure metal or metal alloy, to provide a metallic interlayer exchange coupling layer 150. According to an aspect of the present disclosure, the metallic interlayer exchange coupling layer 150 provides a variable magnetic exchange coupling of which the magnitude and the polarity depends on the magnitude and polarity of a voltage bias between the first reference layer 132 and the free layer 136. The first insulating spacer layer 110 includes an electrically insulating material in a series connection with the magnetic-exchange-coupled layer stack. As used herein, an "electrically insulating material" refers to a material having electrical conductivity less than $1.0 \times 10^{-5}$ S/m. The first insulating spacer layer 110 acts as a resistor by reducing the electrical conductance of the magnetoresistive memory cell 180 so that the current flow and the power consumption of the magnetoresistive memory cell 180 is limited during operation.

The magnetoresistive memory cell 180 can include a first nonmagnetic electrode layer 102 and a second nonmagnetic electrode layer 170. The magnetic-exchange-coupled layer stack 140 and the first insulating spacer layer 110 are electrically connected in series between the first nonmagnetic electrode layer 102 and the second nonmagnetic electrode layer 170.

The first insulating spacer layer 110 can include any tunneling barrier material such as an electrically insulating material, for example magnesium oxide. Other suitable resistor materials, such as insulating materials, for example silicon oxide or aluminum oxide may also be used instead of or in addition to magnesium oxide. The thickness of the first insulating spacer layer 110 can be 0.7 nanometers (nm) to 1.3 nm, such as about 1 nm. In one embodiment, the first insulating spacer layer 110 preferably comprises, and/or consists essentially of, a magnesium oxide layer.

The first reference layer 132 can include a Fe layer, a Co layer, a Ni layer, a Co/Ni multilayer structure or a Co/Pt multilayer structure. The first reference layer 132 can additionally include a thin non-magnetic layer comprised of tantalum having a thickness of 0.2 nm 0.5 nm and a thin CoFeB layer (having a thickness in a range from 0.5 nm to 3 nm). In one embodiment, the first reference layer 132 can comprise, and/or consist of, a first iron layer having a thickness in a range from two atomic layers (i.e., monolayers) of iron to five atomic layers of iron, such as three to four atomic layers of iron. For example, the first reference layer 132 can have a thickness of 2 to 7 nm, such as 3 to 6 nm.

The free layer 136 can include Fe, Co, Ni, or a ferromagnetic alloy including at least one of Fe, Co, and Ni (such as CoFeB) at a composition that provides positive uniaxial magnetic anisotropy. Alternatively, the free layer 136 can include a magnetic Heusler alloy, such as an alloy that does not include Fe, Co or Ni. In one embodiment, the free layer 136 can comprise, and/or consist essentially of, a second iron layer having a thickness in a range from two atomic layers of iron to forty atomic layers of iron, such as three to fifteen atomic layers of iron. For example, the free layer 136 can have a thickness of 2 to 30 nm, such as 3 to 12 nm.

The configuration in which the first reference layer 132 and the free layer 136 have respective positive uniaxial magnetic anisotropy provides bistable magnetization states for the free layer 136. The bistable magnetization states include a parallel state in which the free layer 136 has a magnetization (e.g., magnetization direction) that is parallel to the fixed vertical magnetization (e.g., magnetization direction) of the first reference layer 132, and an antiparallel state in which the free layer 136 has a magnetization (e.g., magnetization direction) that is antiparallel to the fixed vertical magnetization (e.g., magnetization direction) of the first reference layer 132.

The interlayer exchange coupling layer 150 includes an electrically conductive, non-magnetic material that can provide a voltage-dependent exchange coupling between the first reference layer 132 and the free layer 136 such that energy levels of a parallel state and an antiparallel state of the free layer 136 shift in opposite directions upon application of a voltage between the electrode layers (102, 170) (e.g., upon application of a voltage between the first reference layer 132 and the free layer 136).

Suitable materials for the metallic interlayer exchange coupling layer 150 include non-magnetic electrically conductive materials, such as metallic materials (e.g., elemental metals and metal alloys), for example, including but not restricted to, Au, Cu, Cr, and/or Al and their alloys. In one embodiment, the metallic interlayer exchange coupling layer 150 can consist essentially of a metallic element selected from Au, Cu, Cr, and Al. In one embodiment, the interlayer exchange coupling layer 150 can have a thickness in a range from one atomic layer (i.e., monolayer) of the metallic element to fifteen atomic layers of the metallic element, such as from two to four atomic layers. For example, the interlayer exchange coupling layer 150 can have a thickness of 0.1 to 7 nm, such as 0.3 to 5 nm.

In one embodiment, the first reference layer 132 may be provided as a component of a first synthetic antiferromagnetic structure (SAF structure) 120. The first SAF structure 120 can include the first reference layer 132, a first fixed ferromagnetic layer 112 having a magnetization that is antiparallel to the fixed vertical magnetization, and a first antiferromagnetic coupling layer 114 located between the first reference layer 132 and the first fixed ferromagnetic layer 112 facing the first side of the first reference layer 132 opposite to the second side of the first reference layer 132 which faces the interlayer exchange coupling layer 150. The first antiferromagnetic coupling layer 114 has a thickness that induces an antiferromagnetic coupling between the first reference layer 132 and the first fixed ferromagnetic layer 112. In other words, the first antiferromagnetic coupling layer 114 can lock in the antiferromagnetic alignment between the magnetization of the first reference layer 132 and the magnetization of the first fixed ferromagnetic layer 112 to lock in place the magnetizations of the first reference layer 132 and the magnetization of the first fixed ferromagnetic layer 112. In one embodiment, the antiferromagnetic coupling layer can include ruthenium and can have a thickness in a range from 0.3 nm to 1 nm. Generally, the first SAF structure 120 includes the first reference layer 132, the first fixed ferromagnetic layer 112 having a magnetization that is antiparallel to the fixed magnetization direction of the first reference layer 132, and the first antiferromagnetic coupling layer 114 located between, and providing an antiferromagnetic coupling between, the first reference layer 132 and the first fixed ferromagnetic layer 112.

In one embodiment, a nonmagnetic electrode layer is located directly on a surface of the first insulating spacer layer 110, which may be the first nonmagnetic electrode layer 102 illustrated in FIG. 2A or the second nonmagnetic electrode layer 170 illustrated in FIG. 2B. The first nonmagnetic electrode layer 102 can be located on the side of the first SAF structure 120, and the second nonmagnetic electrode layer 170 can be located on the side of the free layer 136.

In one embodiment, a nonmagnetic electrode layer (such as the second nonmagnetic electrode layer 170) may be located directly on the free layer 136 as illustrated in FIG. 2A. In one embodiment, the first fixed ferromagnetic layer 112 can be in contact with the first insulating spacer layer 110, as illustrated in FIG. 2A. In one embodiment, the magnetoresistive memory cell 180 can include a nonmagnetic electrode layer (such as the first nonmagnetic electrode layer 102) in contact with the first fixed ferromagnetic layer 112, as illustrated in FIG. 2B.

Due to RKKY type of interactions, interlayer exchange coupling (IEC) exhibits oscillatory behavior as a function of the non-magnetic interlayer exchange coupling layer 150 thickness. Therefore the thickness of the non-magnetic interlayer exchange coupling layer 150 can be selected alone or in combination with the in-plane strain to achieve negligible IEC in the absence of applied voltage, while maintaining finite voltage induced interlayer exchange coupling.

Referring to FIG. 3, the VCEC based MRAM cell 180 works as follows. In the absence of applied voltage between the electrode layers (102, 170), IEC is zero or very small (i.e., close to zero). Magnetic anisotropy can be either perpendicular or in-plane since interlayer exchange coupling is not determined by the spin-orbit coupling. Applied voltage between the electrode layers (102, 170) results in a finite IEC biasing of the barrier. Thus, a large enough applied voltage leads to magnetization switching of the free layer 136. This control of the magnetization is deterministic because switching of voltage polarity reverses the sign of IEC. Written information can be read by measuring the electrical resistance of the MRAM cell 180. The resistance depends on the relative orientation of free layer 136 and first reference layer 132 magnetizations through the GMR effect. Since the GMR effect is lower than the TMR effect, the read signal of the VCEC based memory device is lower compared to a VCMA based memory device. However it is also possible to read information through the TMR effect in the VCEC based memory device by adding another resistor (e.g., barrier) layer and reference layer, which results in a double barrier magnetic tunneling junction (MTJ) as will be described in reference to FIGS. 4A and 4B below.

Thus, the VCEC based memory device (e.g., MRAM cell 180) is programmed by application of a positive or negative voltage to the device in absence of an external magnetic field using the voltage dependent interlayer exchange coupling, and is read by application of a voltage using the GMR or TMR effect depending on the device structure. For example, as shown in FIG. 3, application of a positive voltage switches the free layer 136 into the parallel state (P) with the first reference layer 132, while application of a negative voltage switches the free layer into the antiparallel state (AP) with the first refence layer. Thus, the applied voltage biases the energy barrier between the parallel and the antiparallel configurations. Reversing the voltage polarity deterministically switches the free layer 136 between the parallel state and antiparallel state. The IEC between the free layer 136 and the first reference layer 132 is zero or close to zero without applied voltage while it has a sufficiently large enough voltage induced part to overcome magnetic anisotropy of the free layer 136.

Optionally, each MRAM cell 180 can include a dedicated steering device, such an access transistor or diode configured to activate a respective stack 140 upon application of a suitable voltage to the steering device. The steering device may be electrically connected between the stack 140 and one of the respective word lines 30 or bit lines 90 of the respective MRAM cell 180. For example, the steering device may be connected between a word line 30 or bit line 90 and the respective electrode (102, 170) of the MRAM cell 180. In one embodiment, the word lines 30 provide signals to the first electrodes 102 and the bit lines 90 provide signals to the second electrodes 170 of the MRAM cells 180 either directly or through a steering device.

In one embodiment, the polarity of the voltage applied to the word line 30 can be changed depending on the polarity of the magnetization state to be programmed in the free layer 136. For example, a voltage of a first polarity can be applied to the word line 30 (with respect to the bit line 90) during a transition from an antiparallel state to a parallel state, and a voltage of a second polarity (which is the opposite of the first polarity) can be applied to the word line 30 during a transition from a parallel state to an antiparallel state. Further, variations in the circuitry for activating the stack 140 are also contemplated herein.

The programming and sense circuitry 570 can include a programming circuitry configured to apply a programming voltage pulse selected from a positive voltage pulse and a negative voltage pulse across the series connection of the magnetic-exchange-coupled layer stack 140 and the first insulating spacer layer 110 in a magnetoresistive memory cell 180. The magnitude of the programming voltage pulse can be selected to induce a transition into a different magnetic state of the free layer 136 in the selected magnetoresistive memory cell 180. For example, the magnitude of the programming voltage pulse can be selected such that the energy level of intermediate states between a parallel state and an antiparallel state illustrated in FIG. 3 is lower than the energy level of the initial magnetic state (which can be a parallel state or an antiparallel state) and higher than the energy level of the final magnetic state (i.e., a target magnetic state that is the opposite of the initial state) of the free layer 136. The programming voltage pulse can have an absolute magnitude in a range from 1 V to 10 V, such as from 1.5 V to 5.0 V, although lesser and greater absolute magnitudes of the programming voltage pulse may also be employed. The duration of the programming voltage pulse may be in a range from 1 ns to 30 ns, such as from 2 ns to 10 ns, although shorter and longer programming voltage durations can also be employed.

The magnetic coupling through the metallic interlayer exchange coupling layer 150 is voltage-controlled, and thus, is herein referred to as voltage-controlled exchange coupling (VCEC). The direction for the energy level shift for the parallel state of the magnetization of the free layer 136 due to the VCEC is the opposite of the direction for the energy level shift for the antiparallel state of the magnetization of the free layer 136 due to the VCEC. The magnitude of the energy level shift for the parallel state of the magnetization of the free layer 136 due to the VCEC can be the same, or substantially the same, as the energy level shift for the antiparallel state of the magnetization of the free layer 136 due to the VCEC. The direction for the energy level shift for the magnetic state of the magnetization of the free layer 136 due to the VCEC is determined by the sign of the exchange coupling provided by the metallic interlayer exchange coupling layer 150 and the polarity of the applied external bias voltage.

According to an aspect of the present disclosure, the applied voltage biases the energy barrier between the parallel state and the antiparallel state of the magnetization of the free layer 136. Reversing voltage polarity deterministically switches between the parallel state and the antiparallel state. In one embodiment, the magnetoresistive memory cell 180 can be designed such that the interlayer exchange coupling between free layer 136 and the first reference layer 132 is zero or substantially zero in the absence of external bias voltage across the first nonmagnetic electrode layer 102 and the second nonmagnetic electrode layer 170. Further, the magnetoresistive memory cell 180 can be designed such that the interlayer exchange coupling between free layer 136 and the first reference layer 132 is large enough to overcome the magnetic anisotropy of the free layer 136 wherein an external bias voltage is applied across the first nonmagnetic electrode layer 102 and the second nonmagnetic electrode layer 170 during operation of the magnetoresistive memory device 500. Relative orientation of the magnetizations between the free layer 136 and the first reference layer 132 can be controlled with the VCEC effect.

The programming and sense circuitry 570 can include a sense circuitry configured to apply a sense voltage pulse across a selected magnetoresistive memory cell 180. The magnitude of the sense voltage pulse is selected to prevent a change in a magnetic state of the free layer in the selected instance of the magnetoresistive memory cell. The sense voltage pulse can have an absolute magnitude in a range from 0.1 V to 4 V, such as from 0.3 V to 1.5 V, although lesser and greater magnitudes of the sense voltage pulse may also be employed. The duration of the sense voltage pulse may be in a range from 5 ns to 300 ns, such as from 10 ns to 50 ns, although shorter and longer programming voltage durations can also be employed.

In one embodiment, the information stored in each magnetoresistive memory cell 180 can be sensed through the giant magnetoresistive (GMR) effect, which offers differential conductance through a magnetoresistive memory cell 180 depending on the relative orientation of the magnetization of the free layer 136 and the magnetization of the first reference layer 132.

Figure 4A:
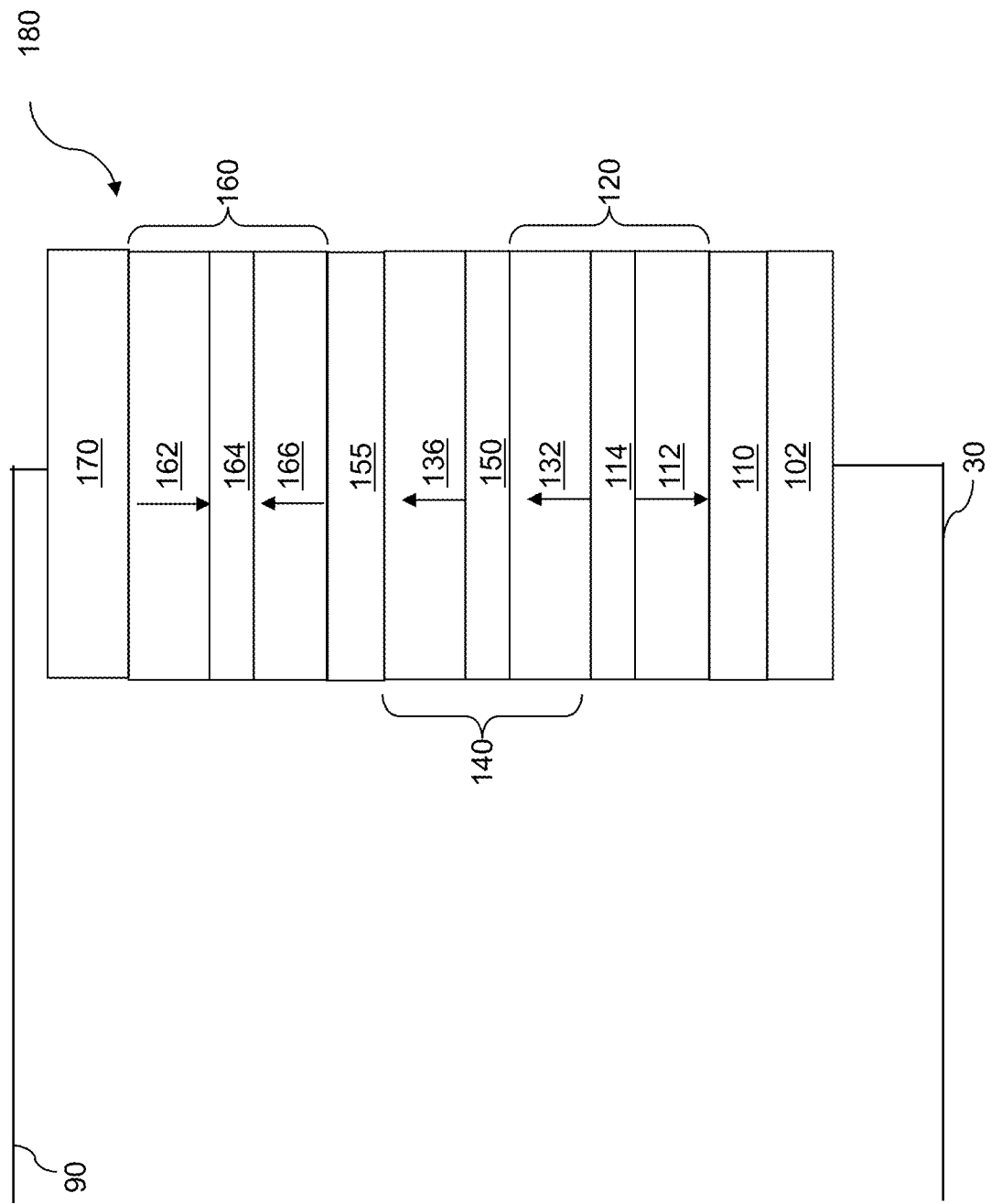
FIG. 4A illustrates a third configuration of the exemplary magnetoresistive memory cell according to an embodiment of the present disclosure.
Figure 4B:
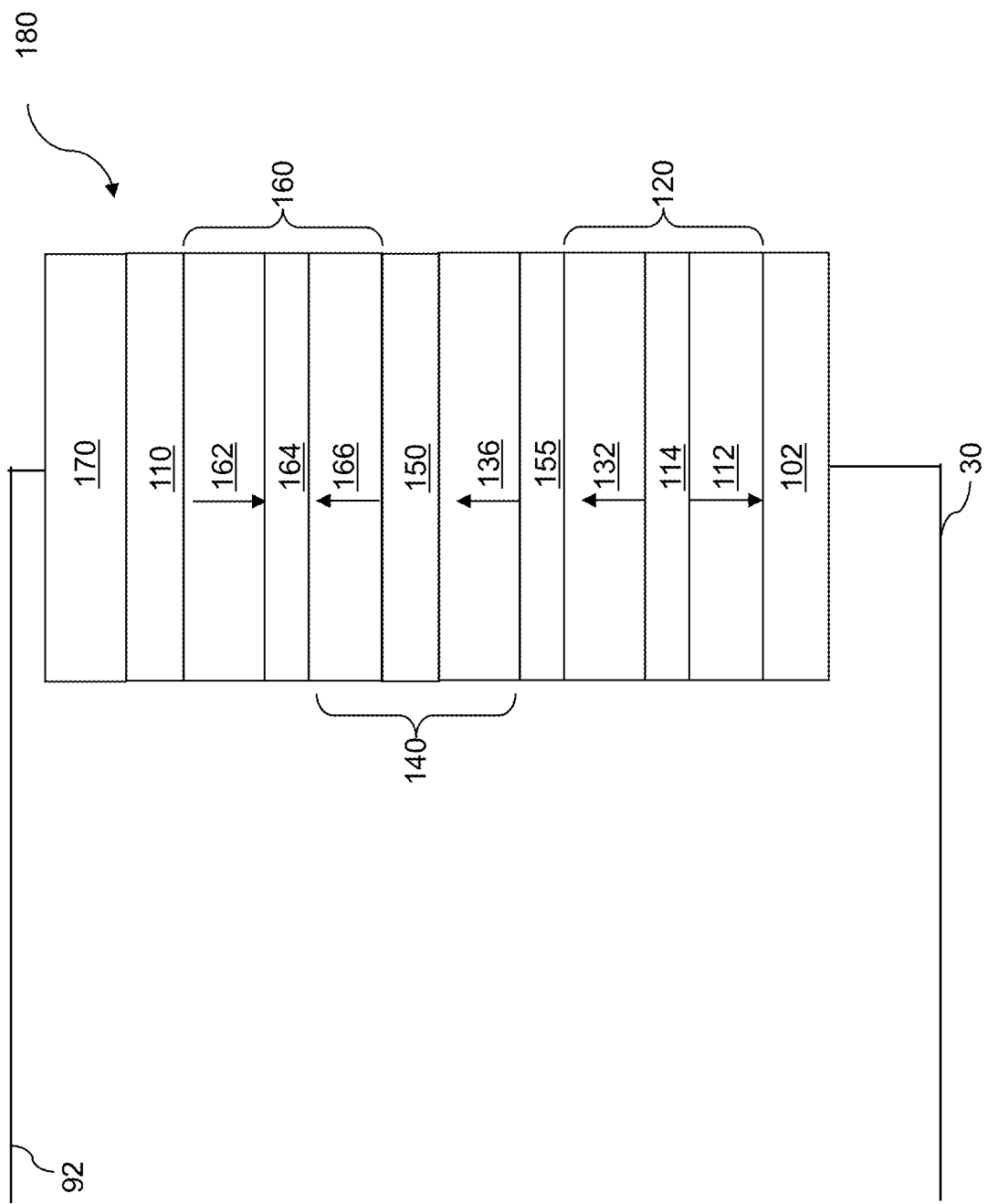
FIG. 4B illustrates a fourth configuration of the exemplary magnetoresistive memory cell according to an embodiment of the present disclosure.

Referring to FIGS. 4A and 4B, an additional structure may be employed to stabilize the preferred direction of magnetization for the free layer 136 along the vertical direction. For example, a second synthetic antiferromagnetic (SAF) structure may be employed to lower the magnetic anisotropy energy for the parallel state and the antiparallel state of the magnetization of the free layer 136 relative to magnetization states that are not parallel or antiparallel to the fixed magnetization direction of the first reference layer 132. In this case, the information stored in each magnetoresistive memory cell 180 may be sensed through tunneling magnetoresistive (TMR) effect.

FIGS. 4A and 4B illustrate a third configuration and a fourth configuration of the magnetoresistive memory cell 180 of the present disclosure, respectively. The third configuration for the magnetoresistive memory cell 180 of FIG. 4A can be derived from the first configuration for the magnetoresistive memory cell 180 illustrated in FIG. 2A by inserting a series connection of a second insulating spacer layer 155 and a second synthetic antiferromagnetic (SAF) structure 160 between the magnetic-exchange-coupled layer stack 140 and the second nonmagnetic electrode layer 170. The second insulating spacer layer 155 can contact the free layer 136.

In the magnetoresistive memory cell 180 of FIG. 4A, the second synthetic antiferromagnetic structure includes an additional reference layer (which is herein referred to as a second reference layer 166), an additional fixed ferromagnetic layer (which is herein referred to as a second fixed ferromagnetic layer 162) having a magnetization that is antiparallel to a magnetization direction of the additional reference layer, and an additional antiferromagnetic coupling layer (which is herein referred to as a second antiferromagnetic coupling layer 164) located between, and providing an antiferromagnetic coupling between the additional reference layer and the additional fixed ferromagnetic layer. The second insulating spacer layer 155 can be located between the second reference layer 166 and the free layer 136.

The fourth configuration for the magnetoresistive memory cell 180 of FIG. 4B can be derived from the second configuration for the magnetoresistive memory cell 180 illustrated in FIG. 2B by providing the above described additional synthetic antiferromagnetic (SAF) structure (which is herein referred to as a second SAF structure 160) and the interlayer exchange coupling layer 150 between the first insulating spacer layer 110 and the free layer 136. In this configuration, the magnetic-exchange-coupled layer stack 140 includes the free layer 136, the second reference layer 166 and the interlayer exchange coupling layer 150 located between the free layer 136 and the second reference layer 166. The second insulating spacer layer 155 is provided between the free layer 136 and the first reference layer 132.

The second insulating spacer layer 155 can include any tunneling barrier material such as an electrically insulating material, for example magnesium oxide. The thickness of the second insulating spacer layer 155 can be 0.7 nm to 1.3 nm, such as about 1 nm. In one embodiment, the second insulating spacer layer 155 comprises, and/or consists essentially of, a magnesium oxide layer.

In one embodiment, the second nonmagnetic electrode layer 170 can be in contact with the second synthetic antiferromagnetic structure 160, as illustrated in FIG. 4A. In one embodiment, the first insulating spacer layer 110 can be located on the second synthetic antiferromagnetic structure 160, and the second nonmagnetic electrode layer 170 can be located on the first insulating spacer layer 110, as illustrated in FIG. 4B. In one embodiment, the magnetoresistive memory cell 180 can include a nonmagnetic electrode layer (such as the first nonmagnetic electrode layer 102) in contact with the first fixed ferromagnetic layer 112 as illustrated in FIG. 4B.

The programming of the magnetoresistive memory cells 180 of FIGS. 4A and 4B can be performed in the same manner as the programming of the magnetoresistive memory cells 180 of FIGS. 2A and 2B. Optionally, the magnitude of the programming voltage pulse may be increased to compensate for a voltage drop across the second insulating spacer layer 155 in the magnetoresistive memory cells 180 of FIGS. 4A and 4B.

The sensing of the magnetic states of the magnetoresistive memory cells 180 of FIGS. 4A and 4B can be performed in the same manner as the sensing of the magnetic states of the magnetoresistive memory cells 180 of FIGS. 2A and 2B with the modification that tunneling magnetoresistive measurements can be employed in lieu of giant magnetoresistive measurements. The sense voltages may be adjusted accordingly.

Figure 5A:
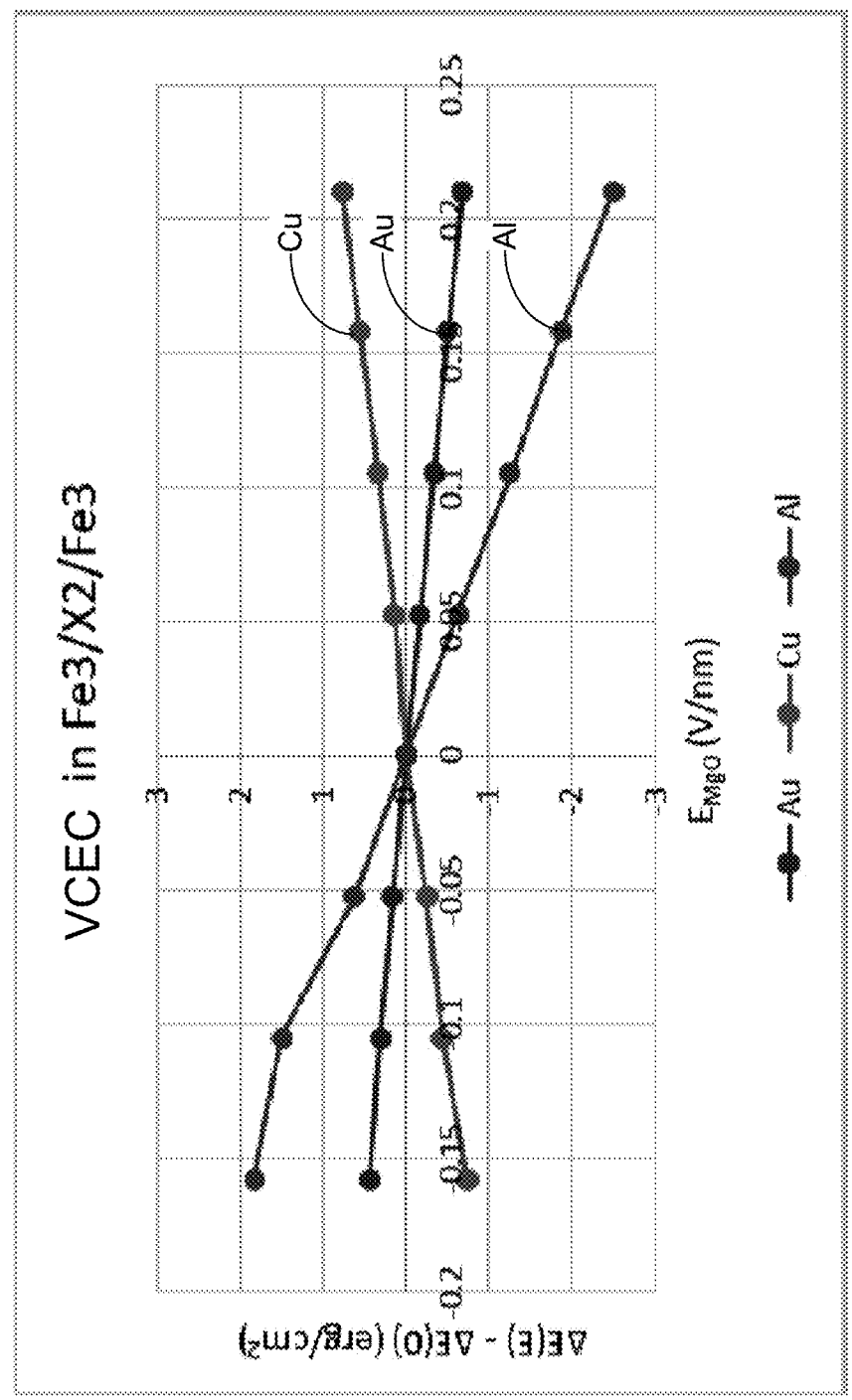
FIG. 5A illustrates a change in the energy difference between the ferromagnetic configuration and the antiferromagnetic configuration as a function of applied electrical field across an insulating spacer layer for a case in which the metallic interlayer exchange coupling layer is two atomic layers thick according to a simulation of device characteristics of the exemplary magnetoresistive memory cell of the present disclosure.
Figure 5B:
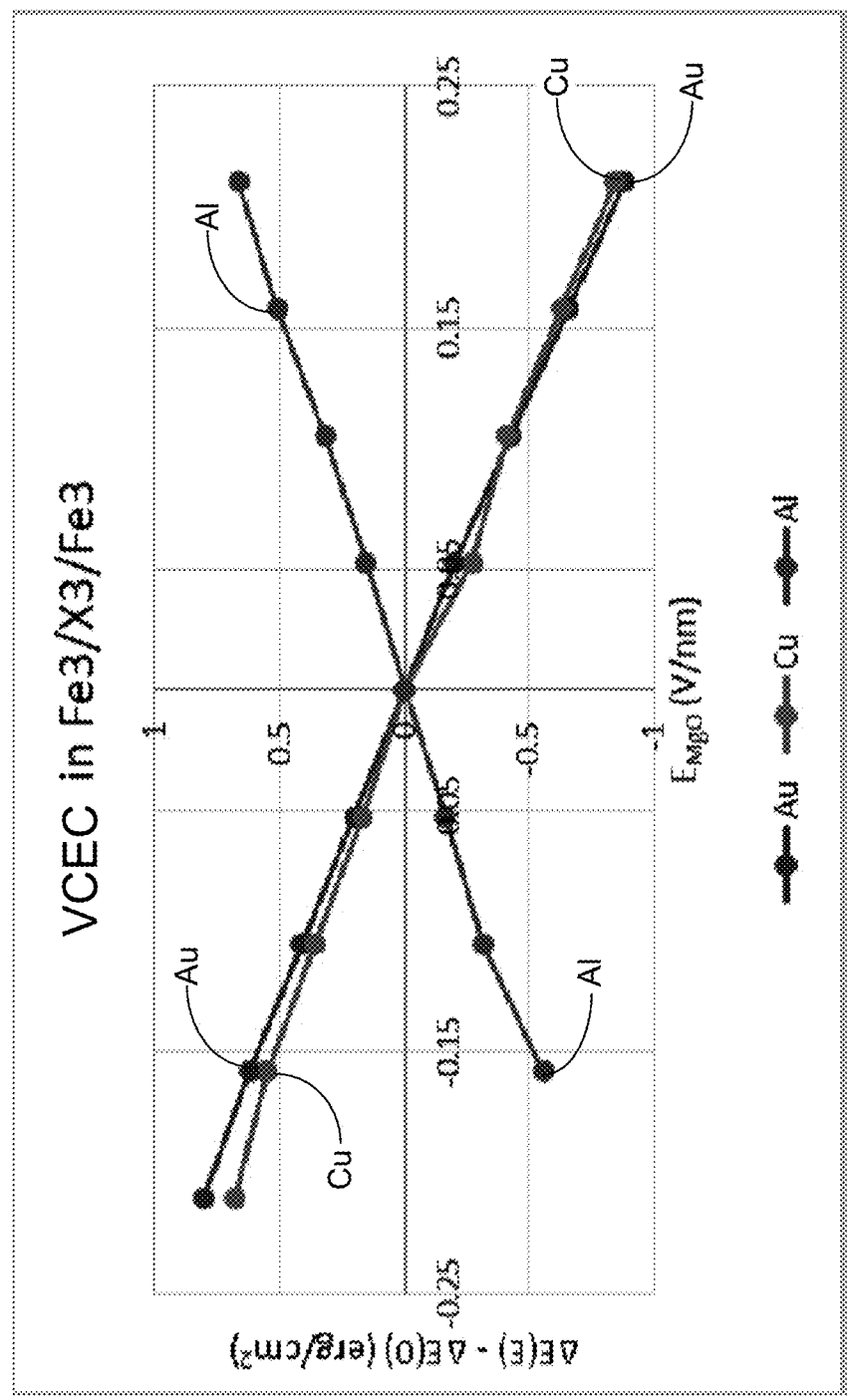
FIG. 5B illustrates a change in the energy difference between the ferromagnetic configuration and the antiferromagnetic configuration as a function of applied electrical field across an insulating spacer layer for a case in which the metallic interlayer exchange coupling layer is three atomic layers thick according to a simulation of device characteristics of the exemplary magnetoresistive memory cell of the present disclosure.
Figure 5C:
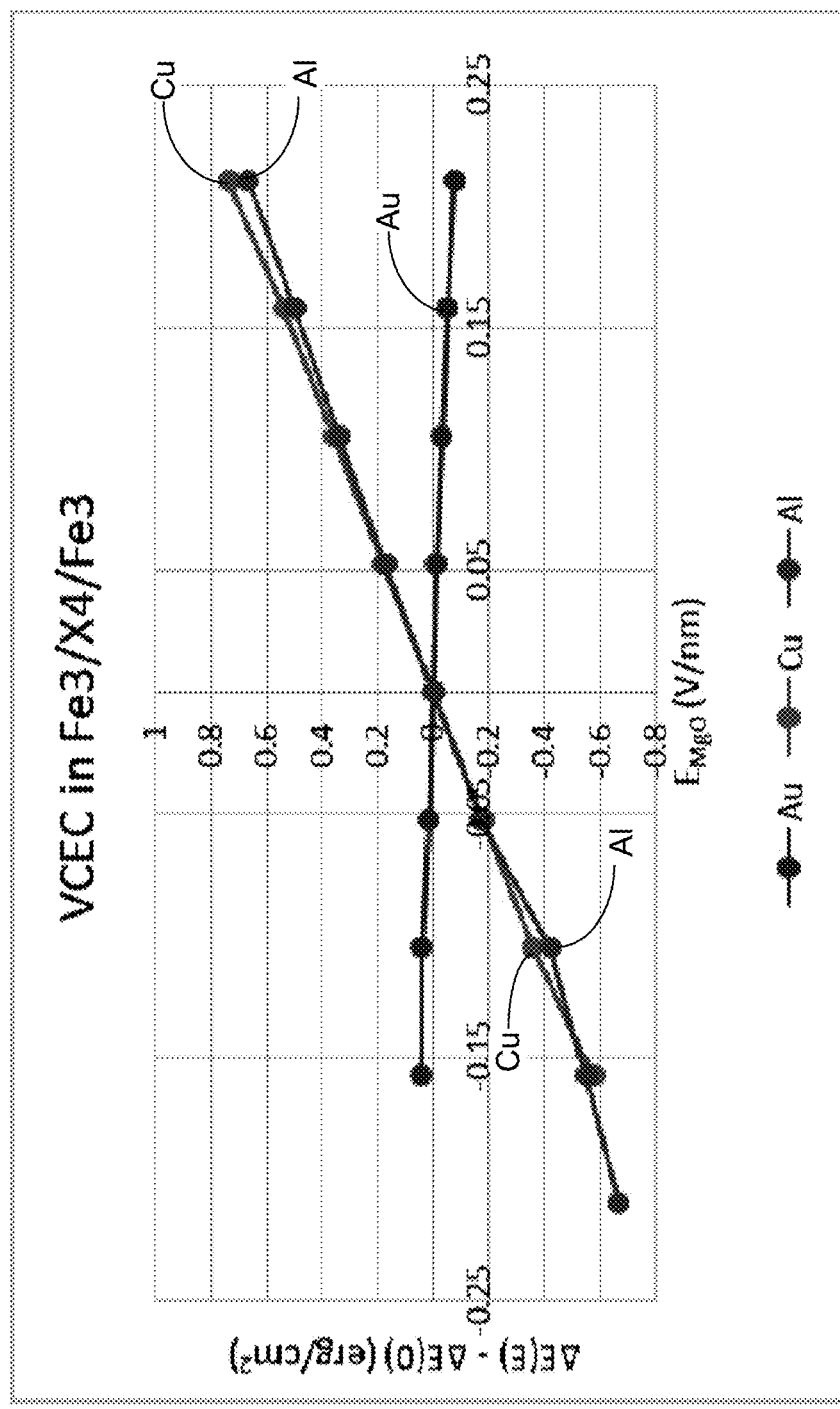
FIG. 5C illustrates a change in the energy difference between the ferromagnetic configuration and the antiferromagnetic configuration as a function of applied electrical field across an insulating spacer layer for a case in which the metallic interlayer exchange coupling layer is four atomic layers thick according to a simulation of device characteristics of the exemplary magnetoresistive memory cell of the present disclosure.
Figure 5D:
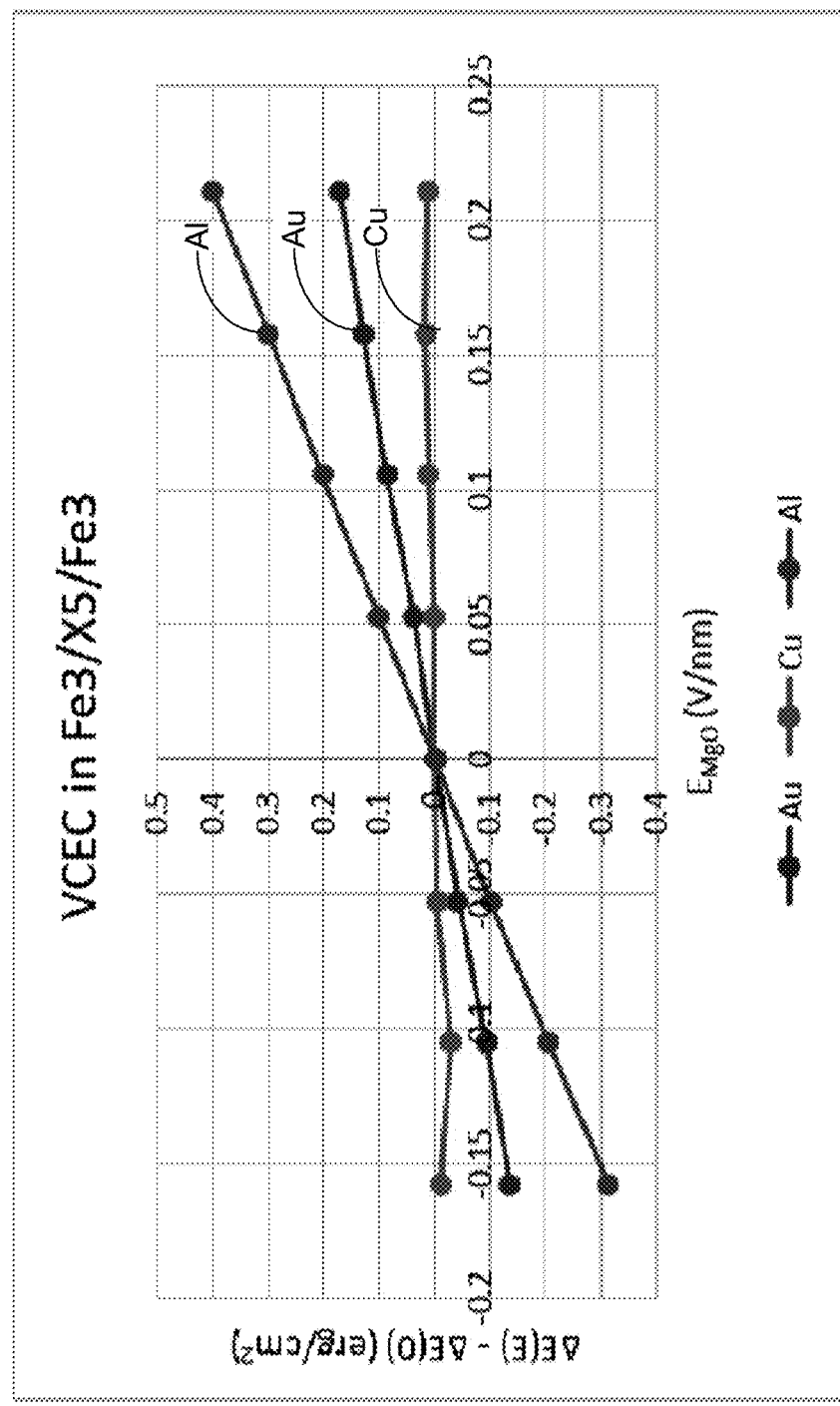
FIG. 5D illustrates a change in the energy difference between the ferromagnetic configuration and the antiferromagnetic configuration as a function of applied electrical field across an insulating spacer layer for a case in which the metallic interlayer exchange coupling layer is five atomic layers thick according to a simulation of device characteristics of the exemplary magnetoresistive memory cell of the present disclosure.

FIGS. 5A-5D illustrate simulation results for a change in the energy difference between the ferromagnetic configuration and antiferromagnetic configuration as a function of applied electrical field across the first insulating spacer layer 110 for various materials and thicknesses of the metallic interlayer exchange coupling layer 150. FIG. 5A corresponds to the case in which the metallic interlayer exchange coupling layer 150 is two atomic layers thick; FIG. 5B corresponds to the case in which the metallic interlayer exchange coupling layer 150 is three atomic layers thick; FIG. 5C corresponds to the case in which the metallic interlayer exchange coupling layer 150 is four atomic layers thick; and FIG. 5D corresponds to the case in which the metallic interlayer exchange coupling layer 150 is five atomic layers thick. In each figure, the free layer 136 and the first reference layer 132 each comprise three monolayer thick iron layers. The results for cells containing Al, Cu and Au interlayer exchange coupling layers 150 are labeled in each figure.

The voltage-controlled exchange coupling (VCEC) energy (which is also referred to as voltage-controlled interlayer exchange coupling energy) is the difference (represented as $\Delta E(E) - \Delta E(0)$, in which $\Delta E = E_{AP} - E_P$) between the energy for the parallel alignment between the first reference layer 132 and the free layer 136 and the energy for the antiparallel alignment between the first reference layer 132 and the free layer 136. The voltage-controlled exchange coupling energy is linearly dependent on the applied external bias voltage across the first insulating spacer layer 110. Changing the polarity of the applied external bias voltage across the first insulating spacer layer 110 changes the sign of the voltage-controlled exchange coupling energy.

The external electrical bias voltage is applied between the first nonmagnetic electrode layer 102 and the second nonmagnetic electrode layer 170, a predominant portion (such as 99%) of which is applied across the first insulating spacer layer 110 in the first and second configurations, or across the first and second insulating spacer layers (110, 155) in the third and fourth configurations.

The VCEC coefficient of proportionality between the voltage-controlled exchange coupling and the electrical field strength across the first insulating spacer layer 110 is tabulated as a function of the material of the metallic interlayer exchange coupling layer 150 and as a function of the thickness of the metallic interlayer exchange coupling layer 150 in Table 1. In other words, the VCEC coefficient is calculated as the total energy difference between parallel and antiparallel orientation of free and reference layers for different values of applied electric field, and exhibits linear dependence with voltage. Changing voltage polarity reverses sign of exchange coupling and IEC depends on the thickness of the interlayer exchange coupling layer 150.

Table 1 below shows the VCEC coefficient of proportionality in units of pJ/Vm between the voltage-controlled exchange coupling and the electrical field strength across the first insulating spacer layer 110 for various materials and thicknesses of the metallic interlayer exchange coupling layer 150 in the magnetoresistive memory cells 180 of embodiments present disclosure. The free layer 136 includes three monolayers of Fe, the first reference layer 132 includes three monolayers of Fe, and the first insulating spacer layer 110 includes MgO in the simulations.

TABLE 1

| Number of Monolayers | Au | Cu | Al | Cr |
|---|---|---|---|---|
| 1 | 2.0 | 0.7 | −9.0 | −1.2 |
| 2 | −3.1 | 3.8 | −12.0 | −0.8 |
| 3 | −4.0 | −3.7 | 3.3 | −4.2 |
| 4 | −0.35 | 3.6 | 3.2 | 1.1 |
| 5 | 0.85 | 0.1 | 2.0 | −1.0 |

Figure 6:
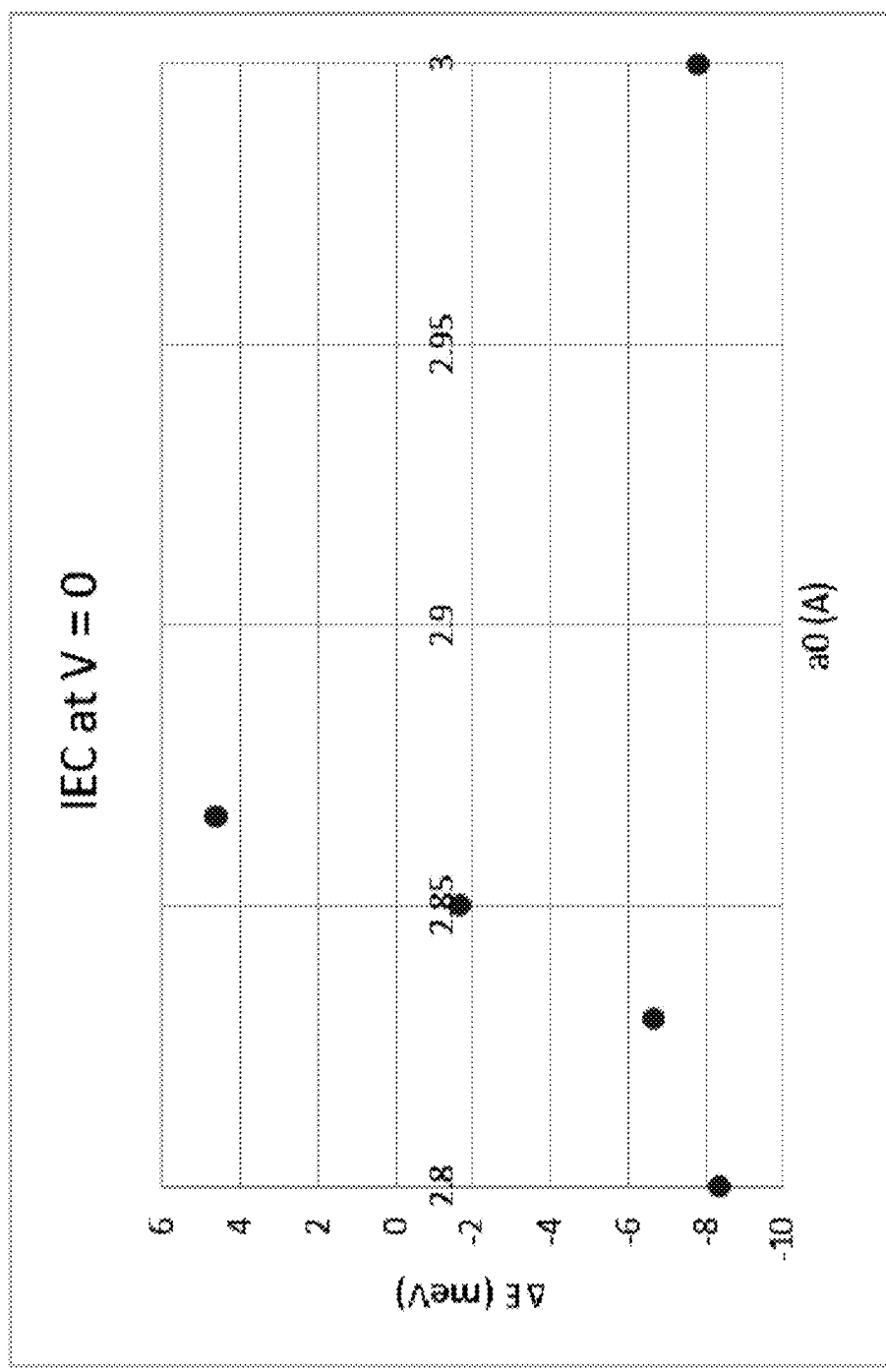
FIG. 6 illustrates the dependence of the interlayer exchange coupling as a function of a lattice constant of magnesium oxide in the insulating spacer layer.

According to an aspect of the present disclosure, the zero voltage exchange coupling energy is dependent on the strain in the first insulating spacer layer 110 and, if present, on the strain in the second insulating spacer layer 155. FIG. 6 shows the dependence of the interlayer exchange coupling as a function of the lattice constant of magnesium oxide in the first insulating spacer layer 110 calculated for a system with 4 monolayers of Al.

The interlayer exchange coupling in the absence of an external bias voltage strongly depends on the in-plane lattice constant (a0) of the first insulating spacer layer 110, which can be controlled by the strain. In the case where MgO is employed for the first insulating spacer layer 110, the interlayer exchange coupling in the absence of an external bias voltage is ferromagnetic for the equilibrium lattice constant of MgO ($a_0$=2.866 Angstroms). The interlayer exchange coupling becomes antiferromagnetic for larger and smaller lattice constants $a_0$. According to an aspect of the present disclosure, the lattice constant of the first insulating spacer layer 110, and/or the lattice constant of the second insulating spacer layer 155, if present, can be tuned to provide zero interlayer exchange coupling in the absence of an applied electrical bias voltage across the first nonmagnetic electrode layer 102 and the second nonmagnetic electrode layer 170. The value of $a_0$ can be tuned to be about 2.85 Angstrom to achieve an IEC value of about zero.

In contrast, the VCEC coefficient only weakly depends on the lattice constant of the first and/or second insulating spacer layers (110, 155) for lattice constants smaller than the equilibrium lattice constant. In the case where MgO is employed for an insulating spacer layer, the VCEC in the absence of an applied external voltage can be large with a reversed sign for large lattice constants of about 3.0 angstroms. This is shown in Table 2 below, which provides the VCEC coefficient of proportionality in units of pJ/Vm for different values of $a_0$ for an MRAM cell containing an MgO insulating spacer layer, three monolayer thick iron first reference layer, four monolayer thick aluminum interlayer coupling layer and three monolayer thick iron free layer.

TABLE 2

Dependence of the VCEC coefficient on the lattice parameter $a_0$ of MgO for a system with 4 monolayers of Al

| $a_0$ (in Angstroms) | VCEC coefficient (in pJ/Vm) |
| --- | --- |
| 2.8 | 2.1 |
| 2.83 | 2.4 |
| 2.85 | 2.8 |
| 2.866 | 3.2 |
| 3 | −3.5 |

The various embodiments of the present disclosure can be employed to provide a magnetoresistive memory device 500 that can operate with low operational current. The switching of the magnetic state of a free layer 136 can be performed deterministically based on the polarity of the applied programming pulse, and without dependence on the duration of the programming voltage pulse. The magnetoresistive memory device 500 can be operated with low power and high reliability through the use of the voltage-controlled exchange coupling provided by the metallic interlayer exchange coupling layer 150.

According to embodiments of the present disclosure, a magnetoresistive memory device (500, 180) includes a magnetic-exchange-coupled layer stack 140 comprising a free layer 136, a reference layer 132 and an electrically conductive, non-magnetic interlayer exchange coupling layer 150 located between the free layer 136 and the reference layer 132, and an insulating spacer layer 110 located in a series connection with the magnetic-exchange-coupled layer stack 140 between a first electrode 102 and a second electrode 170. The first electrode and second electrode are configured to provide a programming voltage across the magnetic-exchange-coupled layer stack 140 and the insulating spacer layer 110.

In one embodiment, the electrically conductive, non-magnetic interlayer exchange coupling layer 150 comprises a metallic interlayer exchange coupling layer. The metallic interlayer exchange coupling layer 150 provides a voltage-dependent exchange coupling between the reference layer 132 and the free layer 136 such that energy levels of a parallel state and an antiparallel state of the free layer 136 shift in opposite directions upon application of respective first and second polarity voltages between the first and second electrodes (102, 170).

In another embodiment, the device (500, 180) lacks external magnets such that the magnetization state of the free layer 136 is configured to be programmed by giant magnetoresistive (GMR) effect in response to application of the programming voltage in the absence of an external magnetic field.

In one embodiment, the device 500 further comprises a programming circuitry 570 configured to apply the programming voltage selected from a positive voltage pulse and a negative voltage pulse between the first electrode 102 and the second electrode 170 across the magnetic-exchange-coupled layer stack 140 and the insulating spacer layer 110 to induce the free layer 136 to transition into a different magnetization state.

In one embodiment, the device 500 further comprises a sense circuitry 570 configured to apply a sense voltage pulse between the first electrode 102 and the second electrode 170, wherein a magnitude of the sense voltage pulse is selected to prevent a change a magnetization state of the free layer 136.

In one embodiment, the interlayer exchange coupling layer 150 consists essentially of a metallic element selected from Au, Cu, Cr, and Al, and the interlayer exchange coupling layer 150 has a thickness in a range from one atomic layer of the metallic element to five layers of the metallic element. In another embodiment, any other suitable electrically conductive, non-magnetic material that can provide exchange coupling may be used instead of or in addition to Au, Cu, Cr, or Al.

In one embodiment, the insulating spacer layer 110 comprises a magnesium oxide layer, the reference layer 132 comprises a first iron layer having a thickness in a range from two atomic layers of iron to forty atomic layers of iron, and the free layer 136 comprises a second iron layer having a thickness in a range from two atomic layers of iron to forty atomic layers of iron.

In another embodiment, the device (500, 180) further comprises a first synthetic antiferromagnetic structure 120 comprising the reference layer 132, a fixed ferromagnetic layer 112 having a magnetization that is antiparallel to the fixed magnetization direction of the reference layer 132, and an antiferromagnetic coupling layer 114 located between the reference layer 132 and the fixed ferromagnetic layer 112.

In another embodiment, the device (500, 180) further comprises a second synthetic antiferromagnetic structure 160 comprising an additional reference layer 166, an additional fixed ferromagnetic layer 162 having a magnetization that is antiparallel to a magnetization direction of the additional reference layer 166, and an additional antiferromagnetic coupling layer 164 located between the additional reference layer 166 and the additional fixed ferromagnetic layer 162, and an additional insulating spacer layer 155 located between the first electrode 102 and the second electrode 170.

In one embodiment, a method of operating the device (500, 180) includes applying a first polarity programming voltage between the first electrode 102 and the second electrode 170 across the magnetic-exchange-coupled layer stack 140 and the insulating spacer layer 110 to switch a magnetization of the free layer 136 from a parallel state to an antiparallel state with the reference layer 132, and applying a second polarity programming voltage opposite to the first polarity voltage between the first electrode 102 and the second electrode 170 across the magnetic-exchange-coupled layer stack 140 and the insulating spacer layer 110 to switch the magnetization of the free layer 136 from the antiparallel state to the parallel state with the reference layer 132.

In one embodiment, the magnetization of the free layer 136 is switched in response to application of the first polarity programming voltage and the second polarity programming voltage in the absence of an external magnetic field. In one embodiment, the first polarity voltage comprises a negative voltage pulse and the second polarity voltage comprises a positive voltage pulse. In one embodiment magnetization of the free layer is switched by giant magnetoresistive (GMR) effect.

In one embodiment, the method also includes applying a sense voltage pulse between the first electrode 102 and the second electrode 170 to read the magnetization of the free layer 136 by the giant magnetoresistive (GMR) effect or by the tunneling magnetoresistive (TMR) effect without changing a magnetization state of the free layer 136.

According to an aspect of the present disclosure, a hybrid magnetoresistive memory cell that can be employed as a magnetoresistive memory cell 180 is provided. The hybrid magnetoresistive memory cell can employ spin-transfer torque (STT) effect and voltage-controlled exchange coupling (VCEC) effect in a manner that the two effects reinforce each other during programming and reduces the programming voltage.

Referring to FIGS. 7A, 7B, 8A, and 8C, four configurations of the hybrid magnetoresistive memory cell are illustrated. Each hybrid magnetoresistive memory cell includes a layer stack that includes at least, from one side to another, a first nonmagnetic electrode layer 102, a reference layer 132, an electrically insulating tunnel barrier layer 134, a free layer 136, a non-magnetic interlayer exchange coupling layer 150, a perpendicular-magnetic-anisotropy (PMA) ferromagnetic layer 280, and a second nonmagnetic electrode layer 170. In one embodiment, the first nonmagnetic electrode layer 102 can be connected to one of the word lines 30, and the second nonmagnetic electrode layer 170 can be connected to one of the bit lines 90. Alternatively, the first nonmagnetic electrode layer 102 can be connected to one of the bit lines 90, and the second nonmagnetic electrode layer 170 can be connected to one of the word lines 30.

The first nonmagnetic electrode layer 102 and the second nonmagnetic electrode layer 170 may consist essentially of at least one nonmagnetic metallic material such as aluminum, copper, tungsten, tantalum, alloys thereof, etc. The first and second nonmagnetic electrode layers (102, 170) may have a shape of a discrete plate that is located in the layer stack, and which contacts a respective word line 30 or bit line 90. Alternatively, the first and second nonmagnetic electrode layers (102, 170) may comprise portions of the respective word line 30 or bit line 90.

Figure 7A:
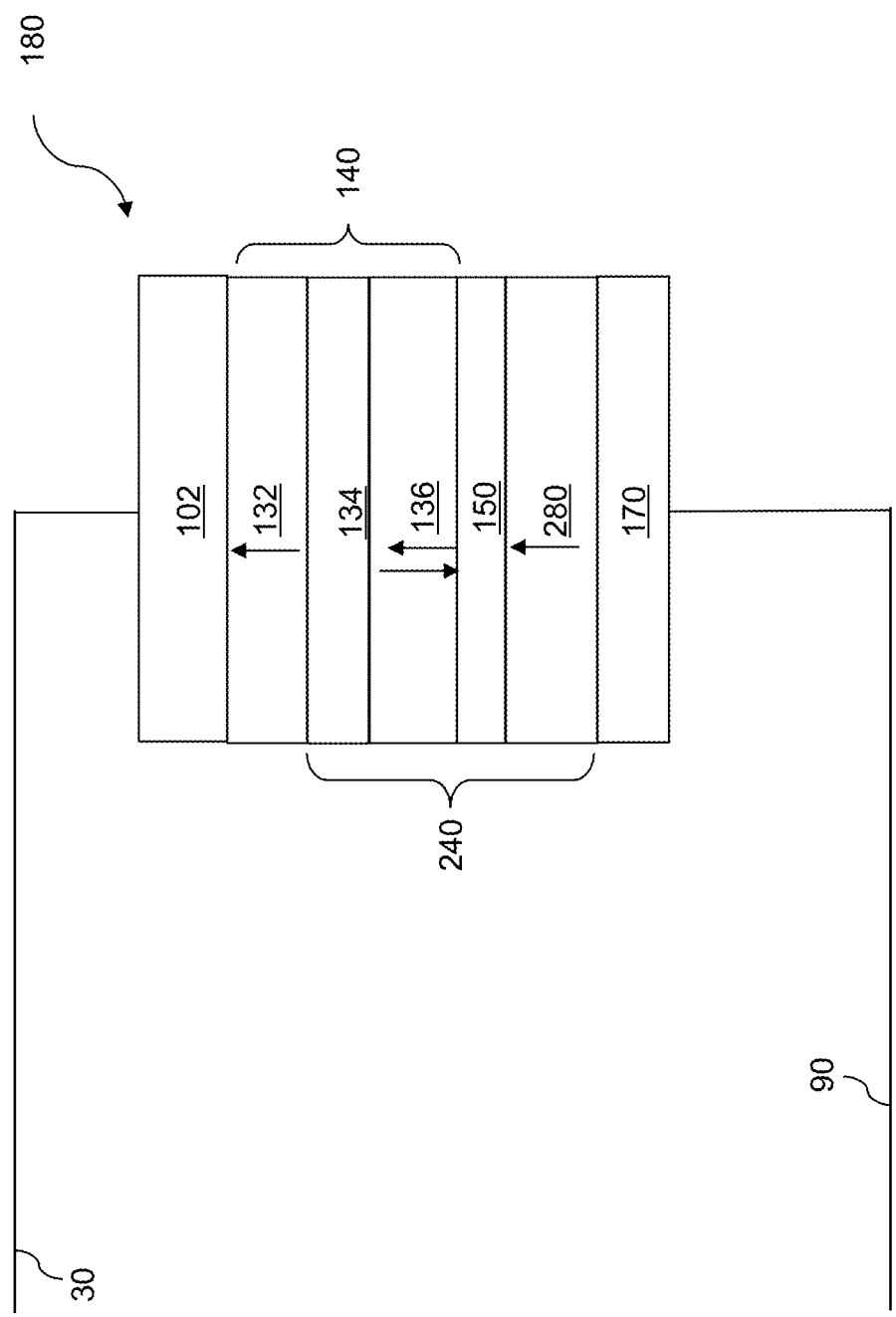
FIG. 7A is a schematic vertical cross-sectional view of a first configuration of a hybrid magnetoresistive memory cell according to an embodiment of the present disclosure.
Figure 7B:
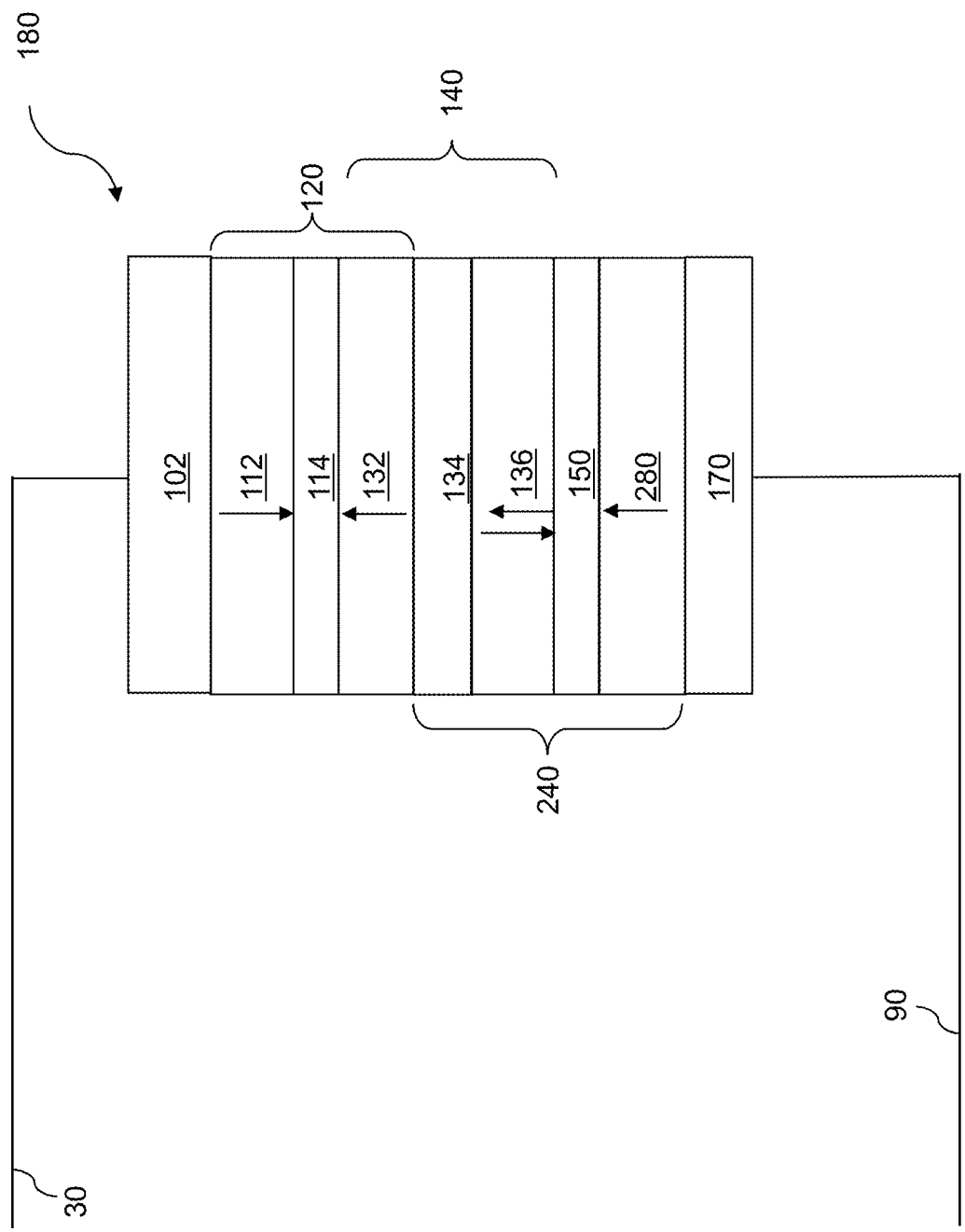
FIG. 7B is a schematic vertical cross-sectional view of a second configuration of a hybrid magnetoresistive memory cell according to an embodiment of the present disclosure.

The second configuration of the hybrid magnetoresistive memory cell illustrated in FIG. 7B differs from the first configuration of the hybrid magnetoresistive memory cell illustrated in FIG. 7B by the presence of a synthetic antiferromagnetic structure (SAF structure) 120.

Specifically, the SAF structure 120 includes the reference layer 132 having a fixed vertical magnetization direction (which may be upward or downward), a fixed ferromagnetic layer 112 having a magnetization that is antiparallel to the fixed vertical magnetization direction of the reference layer 132, and an antiferromagnetic coupling layer 114 located between the reference layer 132 and the fixed ferromagnetic layer 112 and providing antiferromagnetic coupling between the reference layer 132 and the fixed ferromagnetic layer 112. The first antiferromagnetic coupling layer 114 has a thickness that induces an antiferromagnetic coupling between the reference layer 132 and the fixed ferromagnetic layer 112.

The fixed ferromagnetic layer 112 can include a Fe layer, a Co layer, a Ni layer, a CoFeB layer, a CoFe layer, a Co/Ni multilayer structure or a Co/Pt multilayer structure. The reference layer 132 can have a thickness of 2 to 7 nm, such as 3 to 6 nm.

The antiferromagnetic coupling layer 114 can include an antiferromagnetic coupling material such as ruthenium, iridium, iridium-manganese alloy or a multilayer stack of cobalt and platinum layers, and can have a thickness in a range from 0.5 nm to 2 nm. The thickness of the antiferromagnetic coupling layer 114 can be optimized to maximize antiferromagnetic coupling between the reference layer 132 and the free layer 136.

The reference layer 132 includes a material that can provide a high rate of spin-transfer torque to the free layer 136 when tunneling current flows through the tunnel barrier layer 134. The reference layer 132 can include a Fe layer, a Co layer, a Ni layer, a Co/Ni multilayer structure or a Co/Pt multilayer structure. The reference layer 132 may additionally include a thin non-magnetic layer comprised of tantalum having a thickness of 0.2 nm 0.5 nm and a thin CoFeB layer (having a thickness in a range from 0.5 nm to 3 nm). In one embodiment, the reference layer 132 can comprise, and/or consist of, a first iron layer having a thickness in a range from two atomic layers (i.e., monolayers) of iron to five atomic layers of iron, such as three to four atomic layers of iron. For example, the reference layer 132 can have a thickness of 2 to 7 nm, such as 3 to 6 nm.

The tunnel barrier layer 134 can include any tunneling barrier material such as an electrically insulating material, for example magnesium oxide. The thickness of the tunnel barrier layer 134 can be 1.2 nm or less, such as 0.7 nm to 1.2 nm, such as about 0.8 nm to 1 nm.

The free layer 136 can include Fe, Co, Ni, or a ferromagnetic alloy including at least one of Fe, Co, and Ni (such as CoFeB or CoFe), or a multilayer stack such as a $(Co/Pt)_n$ in which n is an integer greater than 1. The composition and the thickness of the free layer 136 can be selected such that the free layer 136 has positive uniaxial magnetic anisotropy, i.e., has a preferred magnetization direction along the vertical direction. For example, the free layer 136 can have a thickness of 2 to 30 nm, such as 3 to 12 nm.

The magnetization direction of the free layer 136 can flip to become parallel to the magnetization direction of the reference layer 132 or to become antiparallel to the magnetization direction of the reference layer 132 depending on the electrical bias voltage applied across the first nonmagnetic electrode layer 102 and the second nonmagnetic electrode layer 170.

The non-magnetic interlayer exchange coupling layer 150 includes a non-magnetic electrically conductive material, such as a metallic material (e.g., elemental metals and metal alloys). In the first configuration and the second configuration, the non-magnetic interlayer exchange coupling layer 150 can include a metallic material that can provide a positive exchange coupling coefficient, i.e., the voltage-controlled exchange coupling (VCEC) coefficient of proportionality. For example, the non-magnetic interlayer exchange coupling layer 150 can include Au, Cu, Cr, and/or Al and their alloys, and the thickness of the non-magnetic interlayer exchange coupling layer 150 can be selected such that the exchange coupling coefficient of the non-magnetic interlayer exchange coupling layer 150 is positive.

In one embodiment, the metallic interlayer exchange coupling layer 150 can consist essentially of a metallic element selected from Au, Cu, Cr, Ru and Al, as described in the prior embodiments. In one embodiment, the interlayer exchange coupling layer 150 can have a thickness in a range from one atomic layer (i.e., monolayer) of the metallic element to fifteen layers of the metallic element, such as from two to four atomic layers. For example, the interlayer exchange coupling layer 150 can have a thickness of 0.1 to 7 nm, such as 0.3 to 5 nm.

The PMA ferromagnetic layer 280 includes a material that can provide high perpendicular magnetic anisotropy (e.g., higher than that of the reference layer 132). Thus, the magnetization direction of the PMA ferromagnetic layer 280 is along a vertical direction, i.e., the direction that is perpendicular to the interfaces between contacting layers within the hybrid magnetoresistive memory cell. The ferromagnetic material of the PMA ferromagnetic layer 280 does not need to generate any spin-polarized current. Thus, any hard magnetic material that can provide high perpendicular magnetic anisotropy can be employed for the PMA ferromagnetic layer 280.

In one embodiment, the PMA ferromagnetic layer 280 comprises a material selected from a FePt alloy, a FePd alloy, a CoPt alloy, a Pt/Co multilayer stack, a Co/Ag multilayer stack, a Co/Cu multilayer stack, a Co/Ni multilayer stack, a (Pt/Co/Pt)/Pd multilayer stack, a (Pt/Co/Pt)/Ag multilayer stack, a (Pt/Co/Pt)/Cu multilayer stack, a (Pt/Co/Pt)/Ni multilayer stack, and a Co/(Pt/Pd) multilayer stack. In an illustrative example, the PMA ferromagnetic layer 280 can include $L1_0$ alloys, such as FePt, FePd, or CoPt disclosed in Journal of Applied Physics 111, 07A708 (2012). The FePt alloy, the FePd alloy, and the CoPt alloy can have a magnetic anisotropy constant of $6.6 \times 10^7$ erg/cm$^3$, $1.8 \times 10^7$ erg/cm$^3$, and $4.9 \times 10^7$ erg/cm$^3$, respectively. In another illustrative example, the PMA ferromagnetic layer 280 can include Pt/Co multiplayers, Co/Ag multilayers, Co/Cu multilayers, or Co/Ni multilayers, or can include (Pt/Co/Pt)/Pd multilayers, (Pt/Co/Pt)/Ag multilayers, (Pt/Co/Pt)/Cu multilayers, or (Pt/Co/Pt)/Ni multilayers disclosed in IEEE Transaction on Magnetics 31, 3337 (1995). In yet another illustrative example, the PMA ferromagnetic layer 280 can include Co/(Pt/Pd) multilayers or Co/(Pd/Pt) multilayers disclosed in Journal of Applied Physics 77, 3995 (1995).

The layer stack including the reference layer 132, the tunnel barrier layer 134 and the free layer 136 constitutes a magnetic tunnel junction (MTJ) 140. The layer stack including the tunnel barrier layer 134, the free layer 136, the non-magnetic interlayer exchange coupling layer 150, and the PMA ferromagnetic layer 280 constitutes a magnetic-exchange-coupled layer stack 240.

In the embodiments of FIGS. 7A and 7B, the fixed magnetization direction of magnetization of the reference layer 132 is parallel to the fixed magnetization direction of the PMA ferromagnetic layer 280, and the materials of the magnetic-exchange-coupled layer stack 240 are selected such that the sign of the exchange coupling coefficient (i.e., the voltage-controlled exchange coupling (VCEC) coefficient of proportionality) across the nonmagnetic tunneling barrier 134 is positive.

In this case, a negative voltage applied between the first nonmagnetic electrode layer 102 and the second nonmagnetic electrode layer 170 causes the magnetization of the free layer 136 to become antiparallel to the fixed magnetization of the reference layer 132. In other words, the negative voltage applied to the first nonmagnetic electrode layer 102 relative to the second nonmagnetic electrode layer 170 causes antiparallel alignment of magnetizations between the free layer 136 and the reference layer 132 to become energetically favorable relative to the parallel alignment of magnetization between the free layer 136 and the reference layer 132 at least partially through the spin-transfer torque effect.

In addition, the negative voltage applied to the first nonmagnetic electrode layer 102 relative to the second nonmagnetic electrode layer 170 causes a voltage-controlled exchange coupling (VCEC) effect under which antiparallel alignment between the magnetization of the free layer 136 and the fixed magnetization of the PMA ferromagnetic layer 280 becomes energetically favorable relative to the parallel alignment between the magnetization of the free layer 136 and the fixed magnetization of the PMA ferromagnetic layer 280 due to the positive VCEC coefficient. Thus, the positive sign of the exchange coupling coefficient and the parallel alignment of the fixed magnetization directions of the PMA ferromagnetic layer 280 and the reference layer 132 are selected such that a condition (e.g., a negative voltage applied between the first nonmagnetic electrode layer 102 and the second nonmagnetic electrode layer 170) that favors antiparallel alignment between the reference layer 132 and the free layer 136 through spin-transfer torque (STT) effect also causes a condition that favors antiparallel alignment between the PMA ferromagnetic layer 280 and the free layer 136 through the voltage-controlled exchange coupling (VCEC) effect. Because the magnetization direction of the PMA ferromagnetic layer 280 is parallel to the magnetization direction of the reference layer 132, energetically favorable antiparallel alignment between the reference layer 132 and the free layer 136 also causes energetically favorable antiparallel alignment between the PMA ferromagnetic layer 280 and the free layer 136. Thus, the VCEC effect assists the STT effect and reduces the magnitude of the negative voltage required to switch the magnetization direction of the free layer 136 to be antiparallel to that of the reference layer 132 and to place the device in the high resistivity state.

In contrast, a positive voltage applied between the first nonmagnetic electrode layer 102 and the second nonmagnetic electrode layer 170 induces a spin-transfer torque effect that causes the magnetization of the free layer 136 to become parallel to the fixed magnetization of the reference layer 132. In other words, the positive voltage applied to the first nonmagnetic electrode layer 102 relative to the second nonmagnetic electrode layer 170 causes parallel alignment of magnetizations between the free layer 136 and the reference layer 132 to become energetically favorable relative to antiparallel alignment of magnetization between the free layer 136 and the reference layer 132 through the spin-transfer torque effect.

In addition, the positive voltage applied between the first nonmagnetic electrode layer 102 and the second nonmagnetic electrode layer 170 causes a voltage-controlled exchange coupling (VCEC) effect under which parallel alignment between the magnetization of the free layer 136 and the fixed magnetization of the PMA ferromagnetic layer 280 becomes energetically favorable relative to the antiparallel alignment between the magnetization of the free layer 136 and the fixed magnetization of the PMA ferromagnetic layer 280 due to the positive VCEC coefficient. As in the case of the negative voltage applied to the first nonmagnetic electrode layer 102, the sign of the exchange coupling and the alignment of the magnetization directions of the PMA ferromagnetic layer 280 and the fixed magnetization of the reference layer 132 are selected such that a condition (e.g., a positive voltage applied between the first nonmagnetic electrode layer 102 and the second nonmagnetic electrode layer 170) that favors parallel alignment between the reference layer 132 and the free layer 136 through spin-transfer torque effect also causes a condition that favors parallel alignment between the PMA ferromagnetic layer 280 and the free layer 136 through the voltage-controlled exchange coupling effect. Thus, the VCEC effect assists the STT effect and reduces the magnitude of the positive voltage required to switch the magnetization direction of the free layer 136 to be parallel to that of the reference layer 132 and to place the device in the low resistivity state.

In other words, the spin-transfer torque effect and the voltage-controlled exchange coupling effect constructively add to amplify reduction in the energy of the antiparallel alignment between the magnetization of the free layer 136, the magnetization of the reference layer 132, and the PMA ferromagnetic layer 280 in case a negative voltage is applied, and to amplify reduction in the energy of the parallel alignment of the magnetization of the free layer 136 relative to the magnetization directions of the magnetization of the reference layer 132 and the PMA ferromagnetic layer 280 in case a positive voltage is applied. Such constructive addition of the spin-transfer torque effect and the voltage-controlled exchange coupling effect is due to parallel alignment of the magnetization directions between the reference layer 132 and the PMA ferromagnetic layer 280 and selection of the materials and the thickness of the stack 240 such that the exchange coupling coefficient is positive.

Figure 8B:
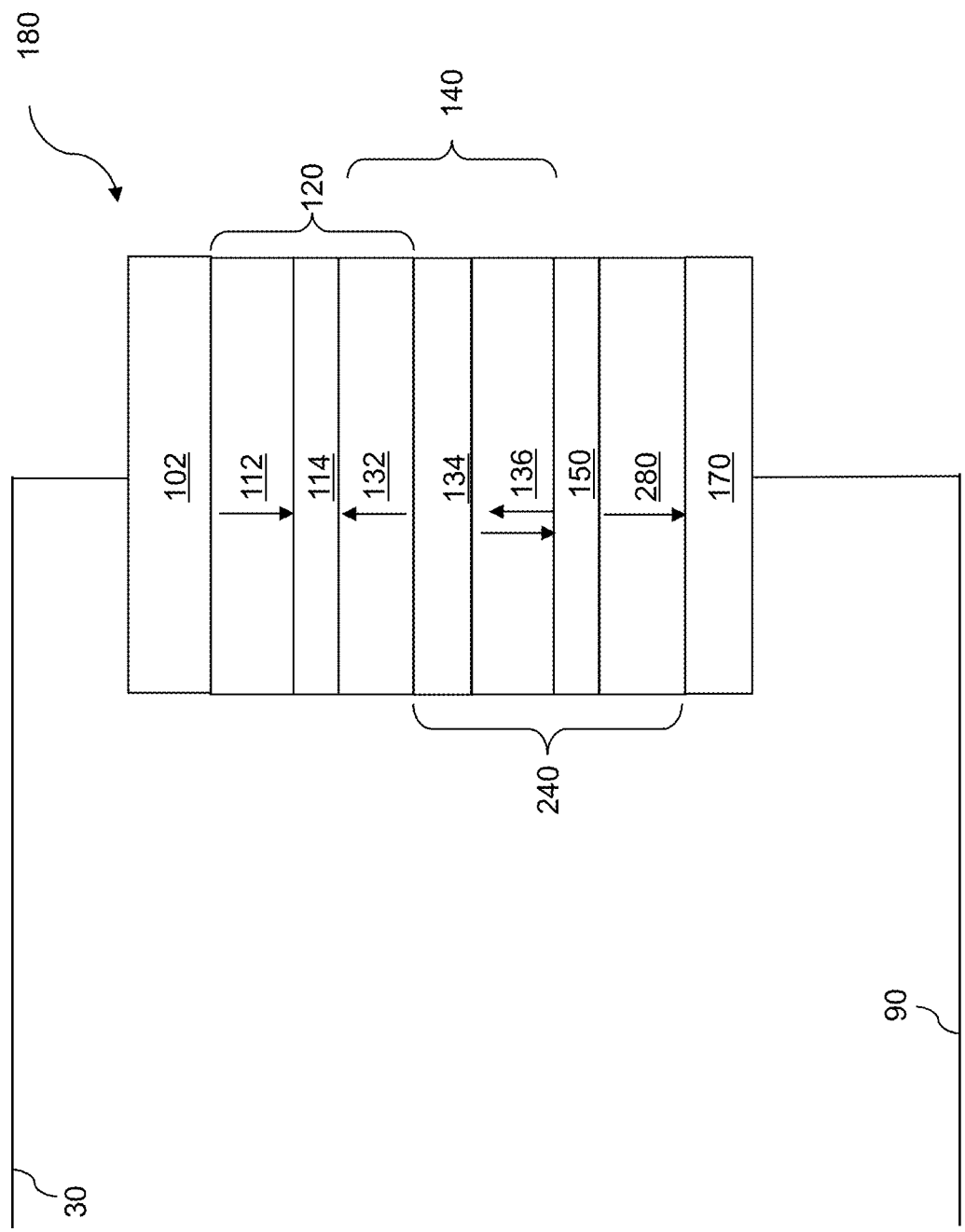
FIG. 8B is a schematic vertical cross-sectional view of a fourth configuration of a hybrid magnetoresistive memory cell according to an embodiment of the present disclosure.

In the embodiments of FIGS. 8A and 8B, the fixed magnetization direction of magnetization of the reference layer 132 is antiparallel to the fixed magnetization direction of the PMA ferromagnetic layer 280, and the materials of the magnetic-exchange-coupled layer stack 240 are selected such that the sign of the exchange coupling coefficient (i.e., the voltage-controlled exchange coupling (VCEC) coefficient of proportionality) across the nonmagnetic tunneling barrier 134 is negative.

In this case, a negative voltage applied between the first nonmagnetic electrode layer 102 and the second nonmagnetic electrode layer 170 causes the magnetization of the free layer 136 to become antiparallel to the fixed magnetization of the reference layer 132. In other words, the negative voltage applied to the first nonmagnetic electrode layer 102 relative to the second nonmagnetic electrode layer 170 causes antiparallel alignment of magnetizations between the free layer 136 and the reference layer 132 to become energetically favorable relative to the parallel alignment of magnetization between the free layer 136 and the reference layer 132 at least partially through the spin-transfer torque effect.

In addition, the negative voltage applied to the first nonmagnetic electrode layer 102 relative to the second nonmagnetic electrode layer 170 causes a voltage-controlled exchange coupling (VCEC) effect under which parallel alignment between the magnetization of the free layer 136 and the fixed magnetization of the PMA ferromagnetic layer 280 becomes energetically favorable relative to the antiparallel alignment between the magnetization of the free layer 136 and the fixed magnetization of the PMA ferromagnetic layer 280 due to the negative VCEC coefficient. Thus, the negative sign of the exchange coupling coefficient and the antiparallel alignment of the fixed magnetization directions of the PMA ferromagnetic layer 280 and the reference layer 132 are selected such that a condition (e.g., a negative voltage applied between the first nonmagnetic electrode layer 102 and the second nonmagnetic electrode layer 170) that favors antiparallel alignment between the reference layer 132 and the free layer 136 through spin-transfer torque (STT) effect also causes a condition that favors parallel alignment between the PMA ferromagnetic layer 280 and the free layer 136 through the voltage-controlled exchange coupling (VCEC) effect. Because the magnetization direction of the PMA ferromagnetic layer 280 is antiparallel to the magnetization direction of the reference layer 132, energetically favorable antiparallel alignment between the reference layer 132 and the free layer 136 also causes energetically favorable parallel alignment between the PMA ferromagnetic layer 280 and the free layer 136. Thus, the VCEC effect assists the STT effect and reduces the magnitude of the negative voltage required to switch the magnetization direction of the free layer 136 to be antiparallel to that of the reference layer 132 and to place the device in the high resistivity state.

In contrast, a positive voltage applied between the first nonmagnetic electrode layer 102 and the second nonmagnetic electrode layer 170 induces a spin-transfer torque effect that causes the magnetization of the free layer 136 to become parallel to the fixed magnetization of the reference layer 132. In other words, the positive voltage applied to the first nonmagnetic electrode layer 102 relative to the second nonmagnetic electrode layer 170 causes parallel alignment of magnetizations between the free layer 136 and the reference layer 132 to become energetically favorable relative to antiparallel alignment of magnetization between the free layer 136 and the reference layer 132 through the spin-transfer torque effect.

In addition, the positive voltage applied between the first nonmagnetic electrode layer 102 and the second nonmagnetic electrode layer 170 causes a voltage-controlled exchange coupling (VCEC) effect under which antiparallel alignment between the magnetization of the free layer 136 and the fixed magnetization of the PMA ferromagnetic layer 280 becomes energetically favorable relative to the parallel alignment between the magnetization of the free layer 136 and the fixed magnetization of the PMA ferromagnetic layer 280 due to the negative VCEC coefficient. As in the case of the negative voltage applied to the first nonmagnetic electrode layer 102, the sign of the exchange coupling and the alignment of the magnetization directions of the PMA ferromagnetic layer 280 and the fixed magnetization of the reference layer 132 are selected such that a condition (e.g., a positive voltage applied between the first nonmagnetic electrode layer 102 and the second nonmagnetic electrode layer 170) that favors parallel alignment between the reference layer 132 and the free layer 136 through spin-transfer torque effect also causes a condition that favors antiparallel alignment between the PMA ferromagnetic layer 280 and the free layer 136 through the voltage-controlled exchange coupling effect. Thus, the VCEC effect assists the STT effect and reduces the magnitude of the positive voltage required to switch the magnetization direction of the free layer 136 to be parallel to that of the reference layer 132 and to place the device in the low resistivity state.

In other words, the spin-transfer torque effect and the voltage-controlled exchange coupling effect constructively add to amplify reduction in the energy of the antiparallel alignment between the magnetization of the free layer 136 and the magnetization of the reference layer 132, in case a negative voltage is applied, and to amplify reduction in the energy of the parallel alignment of the magnetization of the free layer 136 relative to the magnetization direction of the magnetization of the reference layer 132 in case a positive voltage is applied. Such constructive addition of the spin-transfer torque effect and the voltage-controlled exchange coupling effect is due to antiparallel alignment of the magnetization directions between the reference layer 132 and the PMA ferromagnetic layer 280 and selection of the materials and the thickness of the stack 240 such that the exchange coupling coefficient is negative.

If the magnetization directions of the reference layer 132 and the PMA ferromagnetic layer 280 are not aligned in a desired configuration compared to the VCEC coefficient of the stack 240, then the magnetization directions of the reference layer 132 and the PMA ferromagnetic layer 280 may be aligned in the desired configuration by applying an external magnetic field during manufacturing of the hybrid magnetoresistive memory cell. However, the external magnetic field is not applied during the use (i.e., writing and reading) of the completed hybrid magnetoresistive memory cell.

If the VCEC coefficient of the stack 240 is positive and the magnetization directions of the reference layer 132 and the PMA ferromagnetic layer 280 are antiparallel, then an external magnetic field is applied in an arbitrary first direction perpendicular to the interface between the reference layer 132 and the tunnel barrier layer 134 (e.g., up or down with respect to the cell shown in FIG. 7A). The external magnetic field has a magnitude sufficient to switch the magnetization directions of both the reference layer 132 and the PMA ferromagnetic layer 280, such that these directions are parallel to the first direction. After the external magnetic field is applied, the first magnetization direction of the reference layer 132 is parallel to the first magnetization direction of the PMA ferromagnetic layer 280. Thus, after manufacture, the VCEC coefficient of the stack 240 is positive and the magnetization directions of the reference layer 132 and the PMA ferromagnetic layer 280 are parallel, as desired.

Alternatively, if the VCEC coefficient of the stack 240 is negative and the magnetization directions of the reference layer 132 and the PMA ferromagnetic layer 280 are parallel, then a first external magnetic field is applied in an arbitrary first direction perpendicular to the interface between the reference layer 132 and the tunnel barrier layer 134 (e.g., up or down with respect to the cell shown in FIG. 8A). The first external magnetic field has a first magnitude sufficient to switch the magnetization directions of both the reference layer 132 and the PMA ferromagnetic layer 280, such that these directions are parallel in the first direction. Then a second external magnetic field is applied in a second direction opposite to the first direction. The second external magnetic field has a second magnitude lower than the first magnitude. The second magnitude is sufficient to switch only the magnetization direction of the reference layer 132, but is not sufficient to switch the magnetization direction of the PMA ferromagnetic layer 280. After the second external magnetic field is applied, the second magnetization direction of the reference layer 132 is antiparallel to the first magnetization direction of the PMA ferromagnetic layer 280. Thus, after manufacture, the VCEC coefficient of the stack 240 is negative and the magnetization directions of the reference layer 132 and the PMA ferromagnetic layer 280 are antiparallel, as desired.

The resistive state of the hybrid magnetoresistive memory cell of the embodiments of the present disclosure can be measured (i.e., read) by passing a read current through the magnetic tunnel junction 140. If the magnetization directions of the free layer 136 and the reference layer 132 are parallel, the tunneling resistance is low. If the magnetization directions of the free layer 136 and the reference layer 132 are antiparallel, the tunneling resistance is high. Thus, the hybrid magnetoresistive memory cell is programmed (i.e., written) by a combination of the STT and VCEC effects, which decreases the switching voltage magnitudes, and is read by the STT effect (i.e., by passing a tunneling current through the tunnel barrier 134 of the magnetic tunnel junction 140).

The various embodiments of the present disclosure can be employed to provide a hybrid magnetoresistive tunneling device. The spin-transfer torque effect and the voltage-controlled exchange coupling effect add up constructively to reduce the programming voltage for the hybrid magnetoresistive tunneling device. The ratio of the energy shift due to the spin-transfer torque effect and the energy shift due to the voltage-controlled exchange coupling effect can continuously vary, and may be in a range from 99:1 to 1:99, such as from 9:1 to 1:9 and/or from 3:1 to 1:3 and/or 2:1 to 1:2. In some embodiments, the electrically insulating tunnel barrier 134 may be the only electrically insulating layer in the memory cell located between the two electrodes (102, 170). Since the electrically insulating tunnel barrier 134 is relatively thin (e.g., 1.2 nm thick or less), the electrical resistance of the memory cell is decreased which decreases the magnitude of the tunneling current.

Referring to all drawings and according to various embodiments of the present disclosure, a magnetoresistive memory device 180 comprises a first electrode 102, a second electrode 170, and a first layer stack located between the first electrode and the second electrode. The first layer stack comprising a free layer 136, a reference layer 132, an insulating layer (134, 155) located between the free layer and the reference layer, a ferromagnetic layer (166, 280), and an electrically conductive, non-magnetic interlayer exchange coupling layer 150 located between the free layer 136 and the ferromagnetic layer (166, 280).

In the embodiments illustrated in FIGS. 7A, 7B, 8A and 8B, the free layer 136 comprises a ferromagnetic free layer, the reference layer 132 comprises a ferromagnetic reference layer, the insulating layer (134, 155) comprises a tunnel barrier layer 134, the ferromagnetic layer comprises (166, 280) a perpendicular magnetic anisotropy (PMA) ferromagnetic layer 280 having a higher PMA than that of the reference layer 132. The tunnel barrier layer 134 preferably has a thickness of 1.2 nm or less, and the interlayer exchange coupling layer preferably has a thickness of 0.1 to 7 nm.

In the embodiments illustrated in FIGS. 7A and 7B, the reference layer 132 has a magnetization direction that is parallel to a magnetization direction of the PMA ferromagnetic layer 280, and voltage dependent exchange coupling of a second layer stack 240 comprising the tunnel barrier layer 134, the free layer 136, the interlayer exchange coupling layer 150 and the PMA ferromagnetic layer 280 has a positive exchange coupling coefficient.

In the embodiments illustrated in FIGS. 8A and 8B, the reference layer 132 has a magnetization direction that is antiparallel to a magnetization direction of the PMA ferromagnetic layer 280, and voltage dependent exchange coupling of a second layer stack 240 comprising the tunnel barrier layer, the free layer, the interlayer exchange coupling layer and the PMA ferromagnetic layer has a negative exchange coupling coefficient.

In one embodiment, the electrically conductive, non-magnetic interlayer exchange coupling layer 150 consists essentially of at least one metallic element selected from Au, Cu, Cr, Ru and Al, the tunnel barrier layer 134 is the only electrically insulating layer located between the first and the second electrodes (102, 170), and the tunnel barrier layer 134 consists essentially of magnesium oxide. The PMA ferromagnetic layer 280 comprises a material selected from a FePt alloy, a FePd alloy, a CoPt alloy, a Pt/Co multilayer stack, a Co/Ag multilayer stack, a Co/Cu multilayer stack, a Co/Ni multilayer stack, a (Pt/Co/PO/Pd multilayer stack, a (Pt/Co/Pt)/Ag multilayer stack, a (Pt/Co/Pt)/Cu multilayer stack, a (Pt/Co/Pt)/Ni multilayer stack, and a Co/(Pt/Pd) multilayer stack.

In the embodiments illustrated in FIGS. 7B and 8B, the magnetoresistive memory device 180 also includes a synthetic antiferromagnetic structure 120 comprising the reference layer 132, a fixed ferromagnetic layer 112 having a magnetization that is antiparallel to a reference magnetization of the reference layer, and an antiferromagnetic coupling layer 114 located between the reference layer and the fixed ferromagnetic layer.

In one embodiment illustrated in FIG. 1, a magnetoresistive random access memory 500 includes a two-dimensional array of instances of the magnetoresistive memory devices 180, word lines 30 electrically connecting a respective subset of the first electrodes 102 of the two-dimensional array, bit lines 90 electrically connecting a respective subset of the second electrodes 170 of the two-dimensional array, and a programming and sensing circuitry 570 connected to the bit lines 90 and configured to program the magnetoresistive memory device 180 by a combination of spin transfer torque effect and a voltage-controlled exchange coupling effect, and to read the magnetoresistive memory device using a tunnel magnetoresistance (TMR) effect.

In one embodiment, a method of operating the magnetoresistive memory device 180 includes programing the magnetoresistive memory device 180 by a combination of spin transfer torque effect and a voltage-controlled exchange coupling effect, and reading the magnetoresistive memory device 180 by a tunnel magnetoresistance (TMR) effect.

Programing the magnetoresistive memory device 180 comprises applying a first polarity programming voltage to the first electrode 102 relative to the second electrode 170 in a first programming step to switch a magnetization of the free layer 136 from a parallel state to an antiparallel state with respect to a reference magnetization of the reference layer 132, and applying a second polarity programming voltage opposite to the first polarity voltage to the first electrode relative to the second electrode in a second programming step to switch the magnetization of the free layer 136 from the antiparallel state to the parallel state with respect to a reference magnetization of the reference layer 132. In one embodiment, the first polarity programming voltage comprises a negative voltage, and the second polarity programming voltage comprises a positive voltage.

Reading the magnetoresistive memory device comprises determining a magnitude of a tunneling current through the layer stack (e.g., at least through the MTJ 140) without changing a magnetization direction of the free layer 136. Preferably no external magnetic field is applied during the programing the magnetoresistive memory device 180 and programing the magnetoresistive memory device 180 is deterministic.

In one embodiment in which the VCEC coefficient of the stack 240 is positive and the as-manufactured reference layer 132 has the magnetization direction that is antiparallel to the magnetization direction of the PMA ferromagnetic layer 280, then a method of manufacturing the magnetoresistive memory device 180 also includes applying external magnetic field in a first direction perpendicular to an interface between the reference layer 132 and the tunnel barrier layer 134 to switch magnetization directions of both the reference layer 132 and the PMA ferromagnetic layer 180 parallel to the first direction.

In another embodiment in which VCEC coefficient of the stack 240 is negative and the as-manufactured reference layer 132 has the magnetization direction that is parallel to the magnetization direction of the PMA ferromagnetic layer 280, then a method of manufacturing the magnetoresistive memory device 180 also includes applying a first external magnetic field having a first magnitude in a first direction perpendicular to an interface between the reference layer 132 and the tunnel barrier layer 134 to switch magnetization directions of both the reference layer 132 and the PMA ferromagnetic layer 280 parallel to the first direction, and then applying a second external magnetic field having a second magnitude lower than the first magnitude in a second direction opposite to the first direction to switch only the magnetization direction of the reference layer 132 parallel to the second direction while the magnetization direction of the PMA ferromagnetic layer 280 remains parallel to the first direction.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A magnetoresistive memory device comprising:
a first electrode;
a second electrode; and
a first layer stack located between the first electrode and the second electrode, the first layer stack comprising:
a free layer;
a reference layer;
an insulating layer located between the free layer and the reference layer;
a ferromagnetic layer; and
an electrically conductive, non-magnetic interlayer exchange coupling layer located between the free layer and the ferromagnetic layer,
wherein:
the free layer comprises a ferromagnetic free layer;
the reference layer comprises a ferromagnetic reference layer;
the insulating layer comprises a tunnel barrier layer;
the ferromagnetic layer comprises a perpendicular magnetic anisotropy (PMA) ferromagnetic layer having a higher PMA than that of the reference layer;
the tunnel barrier layer has a thickness of 1.2 nm or less; and
the non-magnetic interlayer exchange coupling layer has a thickness of 0.1 to 7 nm;
the reference layer has a magnetization direction that is parallel to a magnetization direction of the PMA ferromagnetic layer; and
voltage dependent exchange coupling of a second layer stack comprising the tunnel barrier layer, the free layer, the interlayer exchange coupling layer and the PMA ferromagnetic layer has a positive exchange coupling coefficient.

2. A method of manufacturing the magnetoresistive memory device of claim 1, in which the reference layer has the magnetization direction that is antiparallel to the magnetization direction of the PMA ferromagnetic layer, the method comprising:
applying external magnetic field in a first direction perpendicular to an interface between the reference layer and the tunnel barrier layer to switch magnetization directions of both the reference layer and the PMA ferromagnetic layer parallel to the first direction.

3. A magnetoresistive memory device comprising:
a first electrode;
a second electrode; and
a first layer stack located between the first electrode and the second electrode, the first layer stack comprising:
a free layer;
a reference layer;
an insulating layer located between the free layer and the reference layer;
a ferromagnetic layer; and
an electrically conductive, non-magnetic interlayer exchange coupling layer located between the free layer and the ferromagnetic layer,
wherein:
the free layer comprises a ferromagnetic free layer;
the reference layer comprises a ferromagnetic reference layer;
the insulating layer comprises a tunnel barrier layer; and
the ferromagnetic layer comprises a perpendicular magnetic anisotropy (PMA) ferromagnetic layer having a higher PMA than that of the reference layer;
the tunnel barrier layer has a thickness of 1.2 nm or less; and
the non-magnetic interlayer exchange coupling layer has a thickness of 0.1 to 7 nm; and
the reference layer has a magnetization direction that is antiparallel to a magnetization direction of the PMA ferromagnetic layer; and
voltage dependent exchange coupling of a second layer stack comprising the tunnel barrier layer, the free layer, the interlayer exchange coupling layer and the PMA ferromagnetic layer has a negative exchange coupling coefficient.

4. A method of manufacturing the magnetoresistive memory device of claim 3, in which the reference layer has the magnetization direction that is parallel to the magnetization direction of the PMA ferromagnetic layer, the method comprising:
applying a first external magnetic field having a first magnitude in a first direction perpendicular to an interface between the reference layer and the tunnel barrier layer to switch magnetization directions of both the reference layer and the PMA ferromagnetic layer parallel to the first direction; and
then applying a second external magnetic field having a second magnitude lower than the first magnitude in a second direction opposite to the first direction to switch only the magnetization direction of the reference layer parallel to the second direction while the magnetization direction of the PMA ferromagnetic layer remains parallel to the first direction.

5. A magnetoresistive memory device comprising:
a first electrode;
a second electrode; and
a first layer stack located between the first electrode and the second electrode, the first layer stack comprising:
a free layer;
a reference layer;
an insulating layer located between the free layer and the reference layer;
a ferromagnetic layer; and
an electrically conductive, non-magnetic interlayer exchange coupling layer located between the free layer and the ferromagnetic layer,
wherein:
the free layer comprises a ferromagnetic free layer;
the reference layer comprises a ferromagnetic reference layer;
the insulating layer comprises a tunnel barrier layer; and
the ferromagnetic layer comprises a perpendicular magnetic anisotropy (PMA) ferromagnetic layer having a higher PMA than that of the reference layer;
the tunnel barrier layer has a thickness of 1.2 nm or less; and
the non-magnetic interlayer exchange coupling layer has a thickness of 0.1 to 7 nm; and
the electrically conductive, non-magnetic interlayer exchange coupling layer consists essentially of at least one metallic element selected from Au, Cu, Cr, Ru and Al;
the tunnel barrier layer is the only electrically insulating layer located between the first and the second electrodes; and
the tunnel barrier layer consists essentially of magnesium oxide.

6. The magnetoresistive memory device of claim 5, wherein the PMA ferromagnetic layer comprises a material selected from a FePt alloy, a FePd alloy, a CoPt alloy, a Pt/Co multilayer stack, a Co/Ag multilayer stack, a Co/Cu multilayer stack, a Co/Ni multilayer stack, a (Pt/Co/Pt)/Pd multilayer stack, a (Pt/Co/Pt)/Ag multilayer stack, a (Pt/Co/Pt)/Cu multilayer stack, a (Pt/Co/Pt)/Ni multilayer stack, and a Co/(Pt/Pd) multilayer stack.

7. A magnetoresistive memory device comprising:
a first electrode;
a second electrode;
a first layer stack located between the first electrode and the second electrode, the first layer stack comprising:
a free layer;
a reference layer;
an insulating layer located between the free layer and the reference layer;
a ferromagnetic layer; and
an electrically conductive, non-magnetic interlayer exchange coupling layer located between the free layer and the ferromagnetic layer; and
a synthetic antiferromagnetic structure comprising the reference layer, a fixed ferromagnetic layer having a magnetization that is antiparallel to a reference magnetization of the reference layer, and an antiferromagnetic coupling layer located between the reference layer and the fixed ferromagnetic layer.

8. A magnetoresistive random access memory, comprising:
a two-dimensional array of magnetoresistive memory devices comprising:
a first electrode;
a second electrode; and a first layer stack located between the first electrode and the second electrode, the first layer stack comprising:
  a free layer;
  a reference layer;
  an insulating layer located between the free layer and the reference layer;
  a ferromagnetic layer; and
  an electrically conductive, non-magnetic interlayer exchange coupling layer located between the free layer and the ferromagnetic layer;
wherein:
  the free layer comprises a ferromagnetic free layer;
  the reference layer comprises a ferromagnetic reference layer;
  the insulating layer comprises a tunnel barrier layer; and
  the ferromagnetic layer comprises a perpendicular magnetic anisotropy (PMA) ferromagnetic layer having a higher PMA than that of the reference layer;
and
word lines electrically connecting a respective subset of the first electrodes of the two-dimensional array;
bit lines electrically connecting a respective subset of the second electrodes of the two-dimensional array; and
a programming and sensing circuitry connected to the bit lines and configured to program the magnetoresistive memory device by a combination of spin transfer torque effect and a voltage-controlled exchange coupling effect, and to read the magnetoresistive memory device by a tunnel magnetoresistance (TMR) effect.

9. A method of operating a magnetoresistive memory device, comprising:
  a first electrode;
  a second electrode; and
  a first layer stack located between the first electrode and the second electrode, the first layer stack comprising:
    a free layer;
    a reference layer;
    an insulating layer located between the free layer and the reference layer;
    a ferromagnetic layer; and
    an electrically conductive, non-magnetic interlayer exchange coupling layer located between the free layer and the ferromagnetic layer; and
  wherein:
    the free layer comprises a ferromagnetic free layer;
    the reference layer comprises a ferromagnetic reference layer;
    the insulating layer comprises a tunnel barrier layer; and
    the ferromagnetic layer comprises a perpendicular magnetic anisotropy (PMA) ferromagnetic layer having a higher PMA than that of the reference layer,
  the method comprising:
    programing the magnetoresistive memory device by a combination of spin transfer torque effect and a voltage-controlled exchange coupling effect; and
    reading the magnetoresistive memory device by a tunnel magnetoresistance (TMR) effect.

10. The method claim 9, wherein the programing the magnetoresistive memory device comprises:
  applying a first polarity programming voltage to the first electrode relative to the second electrode in a first programming step to switch a magnetization of the free layer from a parallel state to an antiparallel state with respect to a reference magnetization of the reference layer; and
  applying a second polarity programming voltage opposite to the first polarity voltage to the first electrode relative to the second electrode in a second programming step to switch the magnetization of the free layer from the antiparallel state to the parallel state with respect to a reference magnetization of the reference layer.

11. The method claim 10, wherein the reading the magnetoresistive memory device comprises determining a magnitude of a tunneling current through the layer stack without changing a magnetization direction of the free layer.

12. The method claim 10, wherein:
  the reference layer has a magnetization direction that is parallel to a magnetization direction of the PMA ferromagnetic layer;
  voltage dependent exchange coupling of a second layer stack comprising the tunnel barrier layer, the free layer, the interlayer exchange coupling layer and the PMA ferromagnetic layer has a positive exchange coupling coefficient;
  the first polarity programming voltage comprises a negative voltage; and
  the second polarity programming voltage comprises a positive voltage.

13. The method claim 10, wherein:
  the reference layer has a magnetization direction that is antiparallel to a magnetization direction of the PMA ferromagnetic layer;
  voltage dependent exchange coupling of a second layer stack comprising the tunnel barrier layer, the free layer, the interlayer exchange coupling layer and the PMA ferromagnetic layer has a negative exchange coupling coefficient;
  the first polarity programming voltage comprises a negative voltage; and
  the second polarity programming voltage comprises a positive voltage.

14. The method claim 10, wherein no external magnetic field is applied during the programing the magnetoresistive memory device.

15. The method claim 14, wherein the programing the magnetoresistive memory device is deterministic.

16. The method claim 9, wherein:
  the electrically conductive, non-magnetic interlayer exchange coupling layer consists essentially of at least one metallic element selected from Au, Cu, Cr, Ru and Al having a thickness of 0.1 to 7 nm; and
  the tunnel barrier layer consists essentially of magnesium oxide having thickness of 1.2 nm or less.

17. The method claim 16, wherein the PMA ferromagnetic layer comprises a material selected from a FePt alloy, a FePd alloy, a CoPt alloy, a Pt/Co multilayer stack, a Co/Ag multilayer stack, a Co/Cu multilayer stack, a Co/Ni multilayer stack, a (Pt/Co/Pt)/Pd multilayer stack, a (Pt/Co/Pt)/Ag multilayer stack, a (Pt/Co/Pt)/Cu multilayer stack, a (Pt/Co/Pt)/Ni multilayer stack, and a Co/(Pt/Pd) multilayer stack.

* * * * *